US010121965B1

(12) United States Patent
Uno et al.

(10) Patent No.: US 10,121,965 B1
(45) Date of Patent: Nov. 6, 2018

(54) RESISTIVE RANDOM ACCESS MEMORY DEVICE CONTAINING DISCRETE MEMORY MATERIAL PORTIONS AND METHOD OF MAKING THEREOF

(71) Applicant: SANDISK TECHNOLOGIES LLC, Plano, TX (US)

(72) Inventors: Tomohiro Uno, Yokkaichi (JP); Shiori Kataoka, Yokkaichi (JP); Yusuke Yoshida, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 15/692,230

(22) Filed: Aug. 31, 2017

(51) Int. Cl.
  *G11C 13/00* (2006.01)
  *H01L 45/00* (2006.01)
  (Continued)

(52) U.S. Cl.
  CPC .......... *H01L 45/06* (2013.01); *G11C 11/5678* (2013.01); *G11C 11/5685* (2013.01);
  (Continued)

(58) Field of Classification Search
  CPC ............ G11C 11/5685; G11C 11/5678; G11C 13/0002; G11C 13/0004; G11C 13/0007;
  (Continued)

(56) References Cited

U.S. PATENT DOCUMENTS 8,349,681 B2  1/2013  Alsmeier et al.
9,343,507 B2  5/2016  Takaki
(Continued)

FOREIGN PATENT DOCUMENTS

JP      2014038984 A    2/2014
WO   WO 2007/004843 A1   1/2007

OTHER PUBLICATIONS

U.S. Appl. No. 15/251,818, filed Aug. 30, 2016, SanDisk Technologies LLC.
(Continued)

*Primary Examiner* — Tan T. Nguyen
(74) *Attorney, Agent, or Firm* — The Marbury Law Group PLLC

(57) ABSTRACT

An alternating stack of insulating layers and electrically conductive layers is formed over a substrate. Sidewalls of the electrically conductive layers are laterally recessed to form laterally recessed regions. After formation of a conformal barrier material layer in the laterally recessed regions and on the sidewalls of the insulating layers, an amorphous precursor memory material layer is deposited in lateral cavities and over the conformal barrier material layer. An anneal process is performed to selectively crystallize portions of the amorphous precursor memory material layer in the lateral cavities into crystalline memory material portions while not crystallizing portions of the amorphous precursor memory material outside the lateral cavities. Remaining amorphous portions of the amorphous precursor memory material layer are removed selective to the crystalline memory material portions. A vertical conductive line is formed on the crystalline memory material portions. The crystalline memory material portions are formed as discrete self-aligned material portions.

20 Claims, 28 Drawing Sheets

(51) Int. Cl.
*G11C 11/56* (2006.01)
*H01L 27/24* (2006.01)

(52) U.S. Cl.
CPC .......... *G11C 13/0007* (2013.01); *H01L 27/24* (2013.01); *H01L 45/124* (2013.01); *H01L 45/145* (2013.01); *H01L 45/149* (2013.01); *H01L 45/1608* (2013.01); *H01L 45/1666* (2013.01); *G11C 13/0002* (2013.01); *G11C 13/0004* (2013.01)

(58) Field of Classification Search
CPC ....... H01L 27/24; H01L 45/06; H01L 45/124; H01L 45/149; H01L 45/1608; H01L 45/1666
USPC ................................. 365/148, 130, 158, 163
See application file for complete search history.

(56) References Cited

U.S. PATENT DOCUMENTS

| | | | |
|---|---|---|---|
| 9,437,658 B2 | 9/2016 | Sakotsubo | |
| 9,620,712 B2 | 4/2017 | Hayashi et al. | |
| 9,634,246 B2* | 4/2017 | Lee | H01L 45/08 |
| 9,666,799 B2* | 5/2017 | Yanagida | H01L 45/141 |
| 2008/0200003 A1 | 8/2008 | Hong et al. | |
| 2011/0049646 A1* | 3/2011 | Lim | H01L 21/28556 |
| | | | 257/410 |
| 2011/0140070 A1* | 6/2011 | Kim | G11C 5/02 |
| | | | 257/5 |
| 2013/0043455 A1 | 2/2013 | Bateman | |
| 2013/0258752 A1* | 10/2013 | Park | G11C 13/0002 |
| | | | 365/148 |
| 2015/0263074 A1 | 9/2015 | Takaki | |
| 2017/0077184 A1* | 3/2017 | Kikuchi | H01L 27/2436 |
| 2017/0221559 A1 | 8/2017 | Chen et al. | |

OTHER PUBLICATIONS

U.S. Appl. No. 15/299,919, filed Oct. 21, 2016, SanDisk Technologies LLC.
U.S. Appl. No. 15/581,078, filed Apr. 28, 2017, SanDisk Technologies LLC.
U.S. Appl. No. 15/611,029, filed Jun. 1, 2017, SanDisk Technologies LLC.
U.S. Appl. No. 15/631,979, filed Jun. 23, 2017, SanDisk Technologies LLC.
U.S. Appl. No. 15/635,935, filed Jun. 28, 2017, SanDisk Technologies LLC.
International Search Report and Written Opinion of the International Search Authority for International Patent Application No. PCTUS2018/034312, dated Sep. 6, 2018, 12 pages.

* cited by examiner

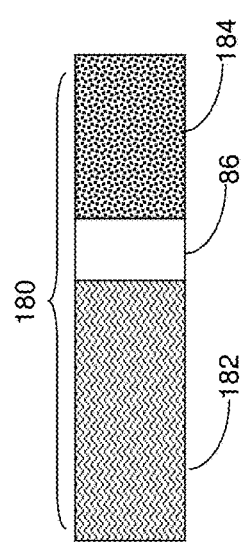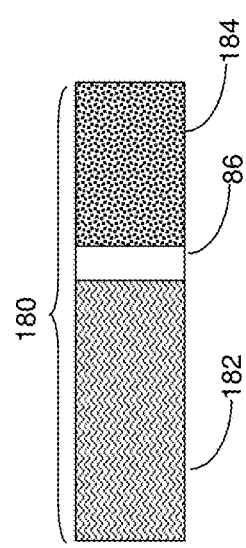

US 10,121,965 B1

RESISTIVE RANDOM ACCESS MEMORY DEVICE CONTAINING DISCRETE MEMORY MATERIAL PORTIONS AND METHOD OF MAKING THEREOF

FIELD

The present disclosure relates generally to the field of semiconductor devices and specifically to a resistive random access memory (ReRAM) device including discrete memory material portions and methods of manufacturing the same.

BACKGROUND

Resistance Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A resistive memory cell can be programmed into a set state having a low electrical resistance, or a reset state having a high resistance. A write operation stores data in a set of resistive memory cells by programming each resistive memory cell into a set state or a reset state depending on the contents of the data. For example, "1" can correspond to a set state and "0" can correspond to a reset state, or vice versa.

SUMMARY

According to an aspect of the present disclosure, a resistive memory device is provided, which comprises: an alternating stack of insulating layers and electrically conductive layers that extend along a first horizontal direction, wherein sidewalls of the electrically conductive layers are laterally recessed relative to sidewalls of the insulating layers to define laterally recessed regions; discrete clam shaped barrier material portions located within a respective one of the laterally recessed regions and vertically spaced apart by the insulating layers; crystalline memory material portions located at least partially in a respective one of the clam shaped barrier material portions; and a vertical conductive line contacting the crystalline memory material portions.

According to another aspect of the present disclosure, a method of forming a resistive memory device is provided. An alternating stack of insulating layers and electrically conductive layers that extend along a first horizontal direction is formed over a substrate. Laterally recessed regions are formed by laterally recessing sidewalls of the electrically conductive layers relative to sidewalls of the insulating layers. A conformal barrier material layer is formed in the laterally recessed regions and on the sidewalls of the insulating layers. Lateral cavities are present in unfilled volumes of the laterally recessed regions. An amorphous precursor memory material layer is deposited in the lateral cavities and over the conformal barrier material layer. Portions of the amorphous precursor memory material layer are selectively crystallized in the lateral cavities into crystalline memory material portions while not crystallizing vertical portions of the amorphous precursor memory material layer on the sidewalls of the insulating layers employing an anneal process. Remaining amorphous portions of the amorphous precursor memory material layer are removed selective to the crystalline memory material portions. A vertical conductive line is formed on the crystalline memory material portions.

BRIEF DESCRIPTION OF THE DRAWINGS

FIG. 7I is a vertical cross-sectional view of the memory array region of the exemplary structure after formation of a doped semiconductor material portion according to an embodiment of the present disclosure.

FIG. 10A is a schematic side view of a memory cell in a reset state according to an embodiment of the present disclosure.

FIG. 10B is a schematic side view of a memory cell in a set state according to an embodiment of the present disclosure.

DETAILED DESCRIPTION

Figure 1:
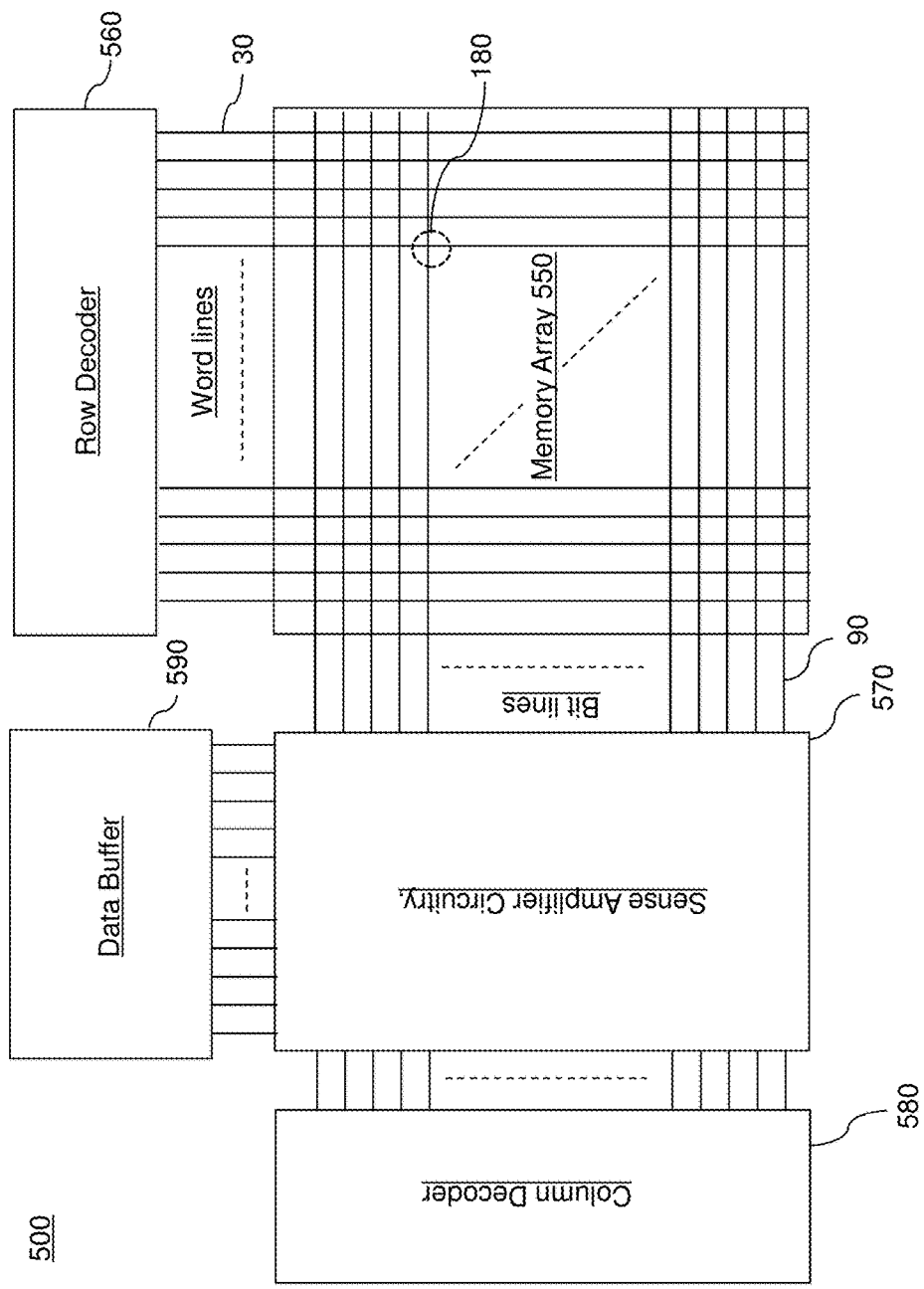
FIG. 1 is a schematic diagram of a memory device including resistive memory cells of the present disclosure in an array configuration.

The present inventors realized that three-dimensional ReRAM devices can include a continuous resistive memory material layer. Such device configurations are prone to leakage current through inactive portions of the continuous resistive memory material layer located between memory levels, i.e., levels of electrically conductive layers that function as word lines. Embodiments of the present disclosure provide a resistive random access memory device containing discrete memory material portions that provide reduced leakage current between neighboring word lines.

As discussed above, the present disclosure is directed to a three-dimensional resistive random access memory (ReRAM) devices and other three-dimensional devices, and methods of making the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

Referring to FIG. 1, a schematic diagram is shown for a non-volatile memory device including non-volatile memory cells of the present disclosure in an array configuration. The non-volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element.

The resistive random access memory device 500 of the present disclosure includes a memory array region 550 containing an array of the respective memory cells 180 located at the intersection of the respective word lines (which may be embodied as first electrically conductive lines 30 as illustrated or as second electrically conductive lines 90 in an alternate configuration) and bit lines (which may be embodied as second electrically conductive lines 90 as illustrated or as first electrically conductive lines 30 in an alternate configuration). The device 500 may also contain a row decoder 560 connected to the word lines, a sense circuitry 570 (e.g., a sense amplifier and other bit line control circuitry) connected to the bit lines, a column decoder 580 connected to the bit lines and a data buffer 590 connected to the sense circuitry. Multiple instances of the resistive memory cells 180 are provided in an array configuration that forms the random access memory device 500. It should be noted that the location and interconnection of elements are schematic and the elements may be arranged in a different configuration.

Each resistive memory cell 180 includes a resistive memory material having at least two different resistive states. The resistive memory material portion is provided between a first electrode and a second electrode within each resistive memory cell 180. Configurations of the resistive memory cells 180 are described in detail in subsequent sections. The resistive memory material portion may include a non-filamentary barrier modulated cell (BMC), which includes a barrier and an electrically conductive metal oxide whose resistivity is switched by at least one of oxygen ion and/or oxygen vacancy diffusion in response to an application of an electric field thereto.

FIGS. 2A to 6C illustrate an optional embodiment process of forming an in-process device containing select transistors and an alternating stack of word lines an insulating layers for a ReRAM device which has three-dimensional vertical bit line ("VBL") configuration. As used herein, a "prototype" structure or an "in-process" structure refers to a transient structure that is subsequently modified in the shape or composition of at least one component therein.

Figure 2A:
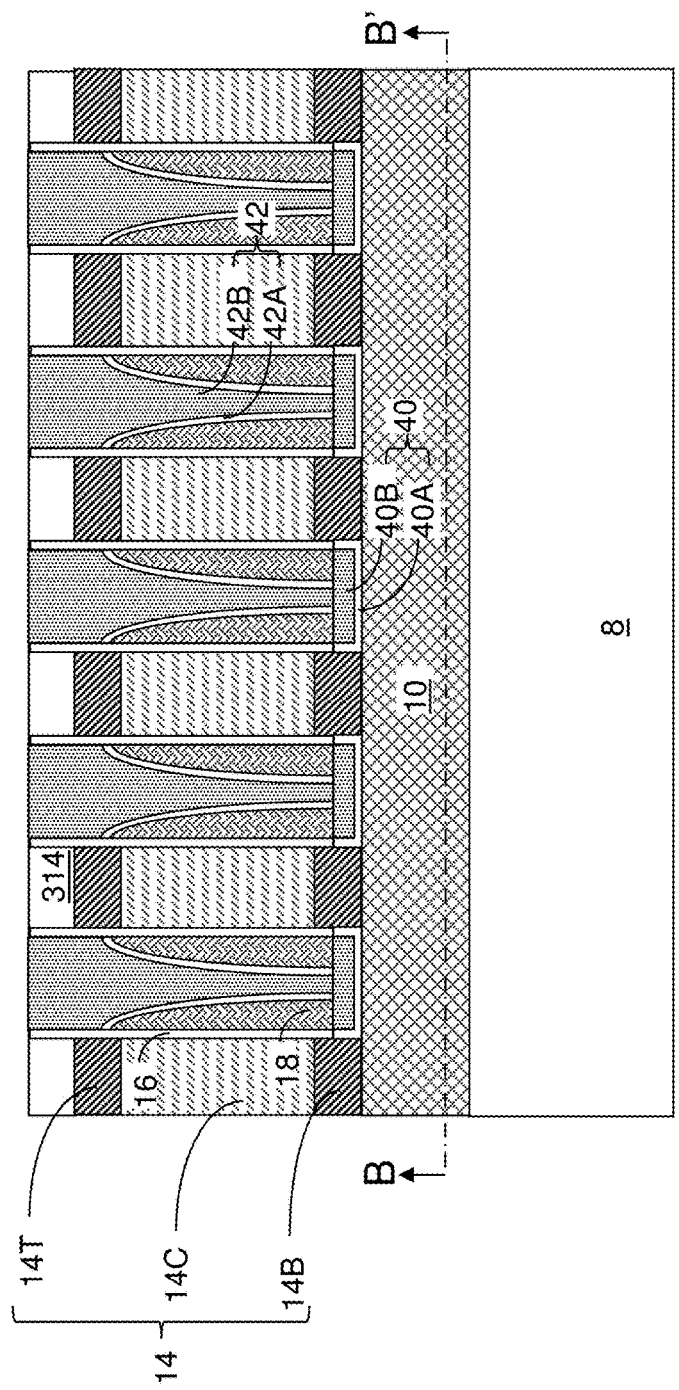
FIG. 2A is a vertical cross-sectional view of an exemplary structure after formation of bit line access transistors and dielectric fill layers according to an embodiment of the present disclosure.
Figure 2B:
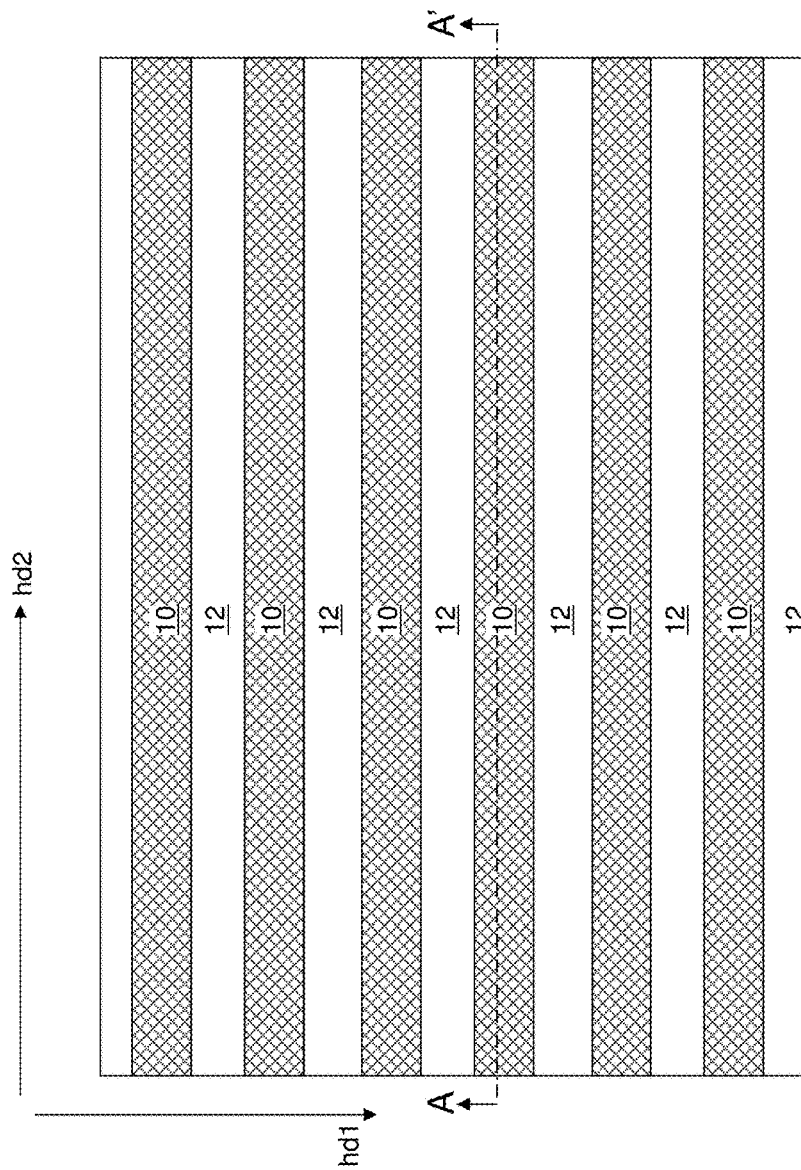
FIG. 2B is a horizontal cross-sectional view of the exemplary structure of FIG. 2A along the horizontal plane B-B' of FIG. 2A.
Figure 2C:
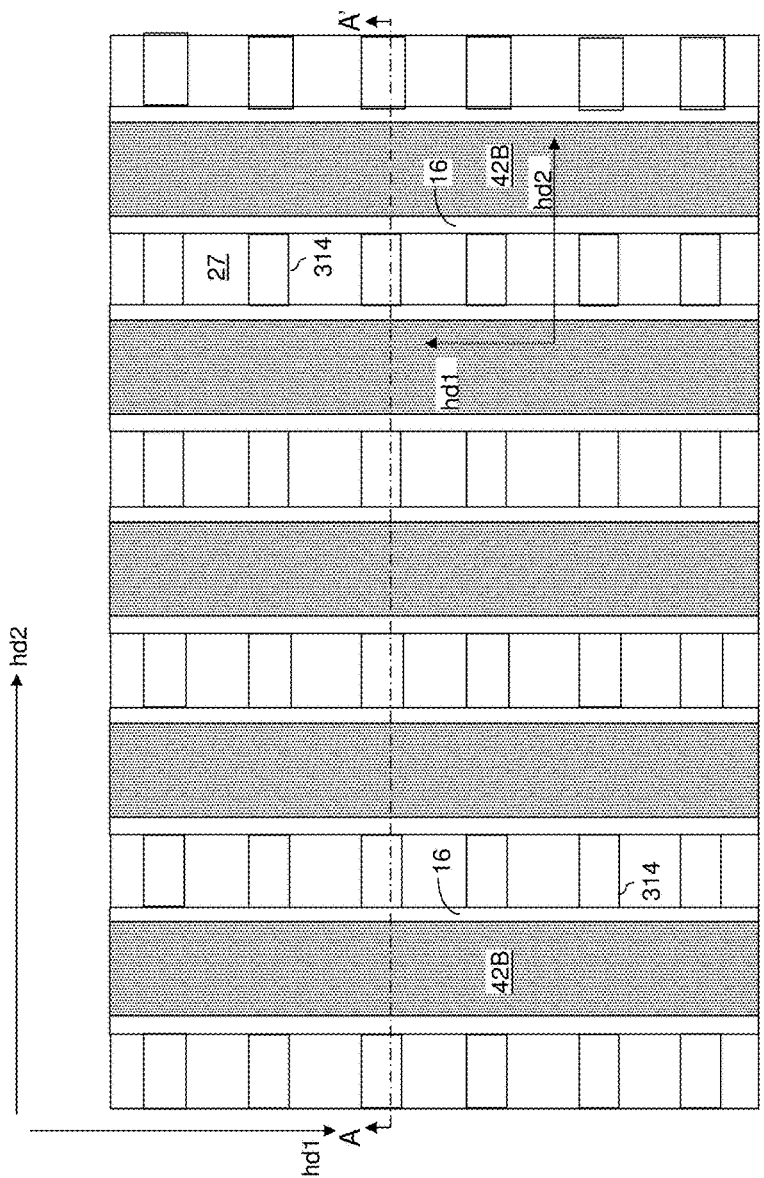
FIG. 2C is a see-through top-down view of the exemplary structure of FIG. 2A. The vertical plane A-A' is the plane of the cross-section for FIG. 2A.

Referring to FIGS. 2A-2C, an exemplary starting structure according to an embodiment of the present disclosure is illustrated, which can be an in-process ReRAM device. The exemplary structure includes a substrate 8, which includes an insulating layer at an upper portion thereof. In one embodiment, the substrate 8 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm. In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense amplifiers, input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated.

Global bit lines 10 are formed over the substrate 8. The global bit lines 10 are parallel electrically conductive lines that are laterally spaced apart in a first horizontal direction hd1, and extending in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer can include, for example, at least one elemental metal (such as W, Co, Cu, and Al), a conductive doped semiconductor material, an intermetallic alloy including at least two elemental metals, a conductive metallic nitride, or a conductive metallic carbide. For example, the at least one conductive material layer can include a metallic barrier layer (such as a layer of TiN, TaN, or WN) and a metal layer (such as a layer of W, Ti, Ta, Cu, Al, or an alloy thereof). The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the second horizontal direction hd2. A one-dimensional array of the global bit lines 10 and the separator dielectric material portions 12 can extend along the first horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the second horizontal direction hd2 and laterally spaced from one another along the first horizontal direction hd1, and filling the trenches with at least one conductive material to form the global bit lines 10 therein.

A two-dimensional array of select devices can be formed on the global bit lines 10 such that multiple select devices are formed on each global bit line 10. In one embodiment, the select devices can be transistor such as vertical thin film transistors employing a polycrystalline semiconductor channel Examples of suitable transistors for the select devices are described, for example, in U.S. patent application Ser. No. 14/206,196, filed Mar. 12, 2014, which is incorporated by reference herein in its entirety. In case the select devices are field effect transistors, the select transistors are herein referred to access transistors.

Bit line access transistors are subsequently formed on global bit line 10. Each access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14B is a drain region). As used herein, an "active region" refers to a source region or a drain region.

The bit line access transistors can be formed by forming a semiconductor layer stack 14 including a first doped semiconductor layer for forming the bottom active regions 14B, a semiconductor channel material layer for forming the semiconductor channels 14C, and a second doped semiconductor layer for forming the top active regions 14T, which has a same type of doping as the first semiconductor layer. The semiconductor layer stack 14 can be patterned employing a combination of lithographic methods and an anisotropic etch such that each patterned portion of the semiconductor layer stack 14 is a rail structure that laterally extend along the first horizontal direction, and is laterally spaced apart among one another along the second horizontal direction by line trenches that extend along the first horizontal direction.

A spacer dielectric layer 40 can be formed at the bottom the line trenches by depositing a self-planarizing dielectric material (such as spin-on glass) or by filling the trenches with a dielectric material (such as organosilicate glass), planarizing the deposited dielectric material, and recessing the dielectric material selective to the rail structures including the materials of the semiconductor layer stack 14. Each spacer dielectric layer 40 can be formed over of the global bit lines 10 and the separator dielectric material portions 12 such that the top surface of the spacer dielectric layer 40 is located at a target height for placing a bottom edge of gate electrodes 18 to be subsequently formed. For example, the top surface of the spacer dielectric layer 40 can be at a level about the interface between the remaining portions of the first conductivity type semiconductor layer and the channel material layer. In one embodiment, each spacer dielectric liner 40 can include a first dielectric liner 40A such as a silicon nitride liner and a second dielectric liner 40B such as a silicon oxide liner.

The gate dielectrics 16 and the gate electrodes 18 of the access transistors can be subsequently formed, for example, by depositing a conformal gate dielectric layer (e.g., silicon oxide) and a conformal conductive material layer (e.g., heavily or degenerately doped polysilicon) in the line trenches that separate the one-dimensional array of rail structures, and by anisotropically etching the conformal conductive material layer. The remaining vertical portions of the conformal conductive material layer constitute the gate electrodes 18, which extend along the first horizontal direction hd1. Each remaining portion of the conformal gate dielectric layer constitutes a gate dielectric 16. Each gate electrode 18 is laterally spaced from an adjacent rail structure by a vertical portion of a gate dielectric 16.

Remaining volumes of the line trenches are filled with at least one dielectric material. Excess portions of the at least one dielectric material can be removed from above the horizontal plane including the top surfaces of the rail structures (including the materials of the semiconductor layer stack 14) by a planarization process, which can employ, for example, chemical mechanical planarization. Each remaining portion of the deposited dielectric material in the trenches constitutes a dielectric rail structure 42, which is also referred to as an access transistor level dielectric rail. In one embodiment, each dielectric rail structure 42 can include a dielectric rail liner 42A and a dielectric rail fill material portion 42B. Each dielectric rail structure 42 extends along the first horizontal direction hd1.

The rail structures that include the materials of the semiconductor layer stack 14 can be patterned to form a two-dimensional array of pillar cavities that extend to the top surfaces of the separator dielectric material portions 12. For example, a photoresist layer can be applied over the rail structures that include the materials of the semiconductor layer stack 14 and the dielectric rail structures 42, and can be lithographically patterned to form openings in areas overlying the separator dielectric material portions 12. A one-dimensional array of line patterns can be employed, in which each line pattern laterally extends along the second horizontal direction. An anisotropic etch that removes semiconductor materials of the semiconductor layer stack 14 selective to the material of the access transistor dielectric rails 42 can be performed employing the patterned photoresist layer as an etch mask to form the two-dimensional array of pillar cavities. After removal of the photoresist layer, the pillar cavities can be filled with a dielectric material to form dielectric pillar spacers 27, as shown in FIG. 2C.

Each patterned portion of the semiconductor layer stack 14 can be a semiconductor pillar structure (14B, 14C, 14T) including a vertical stack of a bottom active region 14B, a semiconductor channel 14C, and a top active region 14T. The dielectric pillar spacers 27 are located between each neighboring pair of semiconductor pillar structures (14B, 14C, 14T) that are laterally spaced apart along the first horizontal direction hd1. Each alternating sequence of dielectric pillar spacers 27 and semiconductor pillar structures (14B, 14C, 14T) that extend along the first horizontal direction hd1 forms a composite rail structure (14B, 14C, 14T, 27). The composite rail structures (14B, 14C, 14T, 27) are laterally spaced from one another along the second horizontal direction hd2.

Optionally, top surfaces of the top active regions 14T may be optionally vertically recessed, and a sacrificial material can be deposited to temporarily protect the semiconductor pillar structures (14B, 14C, 14T) during subsequent processing steps. The sacrificial material can be planarized so that the top surfaces of the remaining sacrificial material portions are coplanar with the top surfaces of the dielectric rail structures 42. The sacrificial material portions are herein referred to as sacrificial cap structures 314. If the sacrificial cap structures 314 are present, each composite rail structure (14B, 14C, 14T, 27, 314) includes a row of sacrificial cap structures 314.

Each composite rail structure (14B, 14C, 14T, 27, 314) includes remaining portions of the semiconductor layer stack 14 and the dielectric pillar spacers 27 between a neighboring pair of dielectric rail structures 42. Each dielectric rail structure 42 can have a substantially vertical bottom portion, or can have a tapered bottom portion in which the width of the dielectric rail structure 42 monotonically or strictly increases as a function of a vertical distance from the substrate 8. In one embodiment, each dielectric rail structure 42 can include at least one dielectric material such as silicon nitride and/or silicon oxide. The dielectric rail structures 42 and the composite rail structures (14T, 14C, 14B, 27, 314) alternate along the second horizontal direction hd2.

Figure 3A:
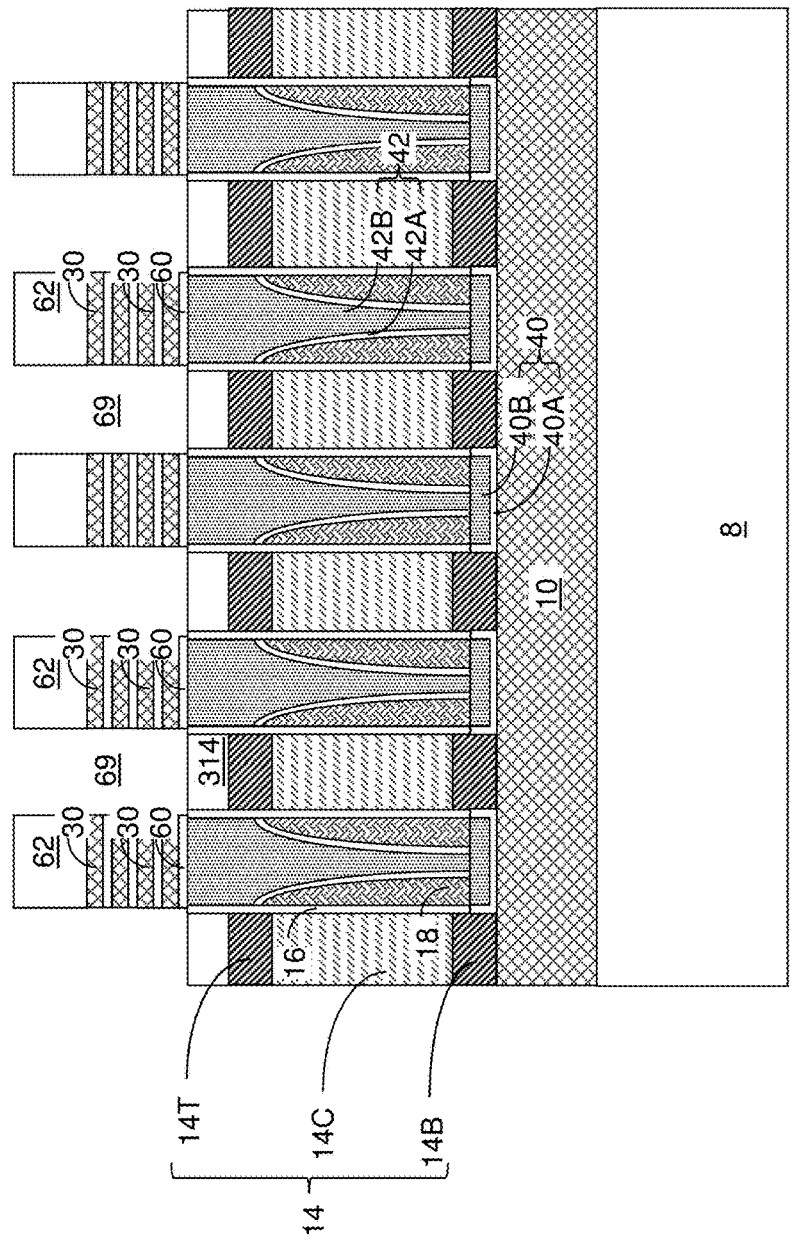
FIG. 3A is a vertical cross-sectional view of the exemplary structure after formation of alternating stacks of insulating layers and conductive material layers according to an embodiment of the present disclosure.
Figure 3B:
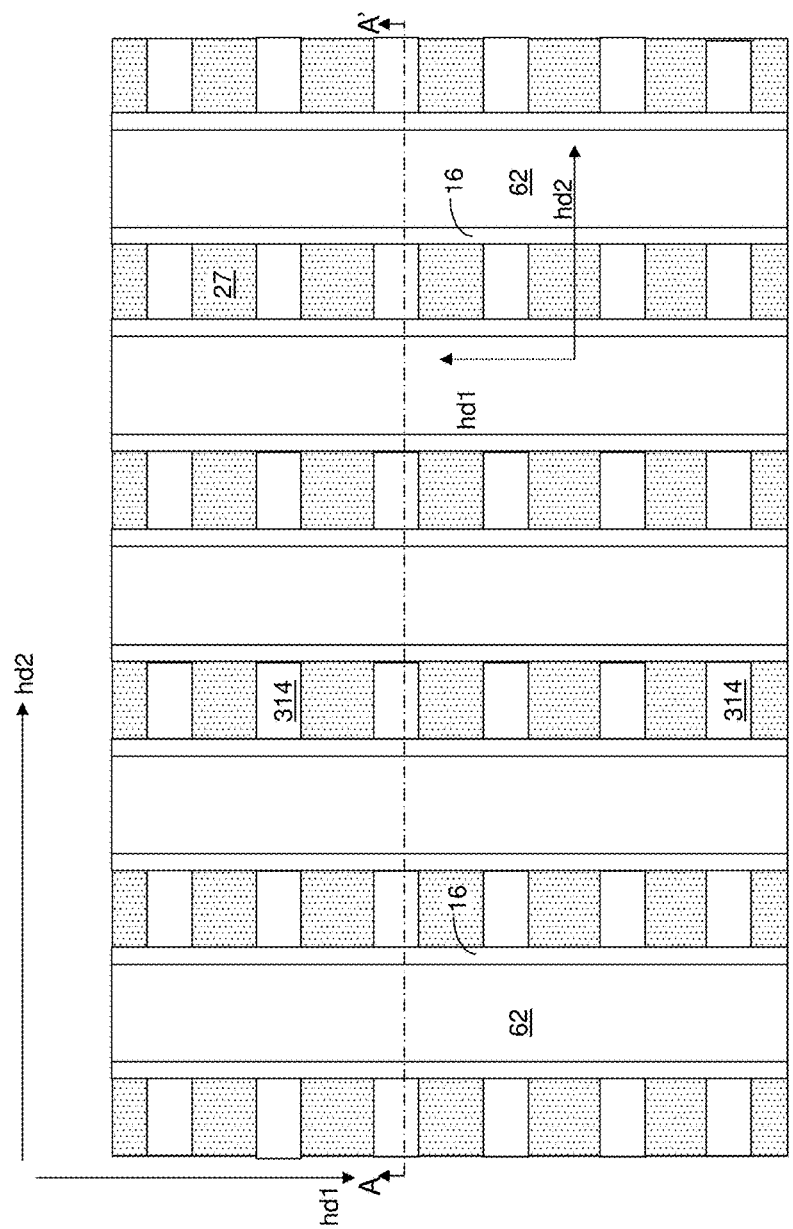
FIG. 3B is a top-down view of the exemplary structure of FIG. 3A. The vertical plane A-A' is the plane of the cross-section for FIG. 3A.

Referring to FIGS. 3A and 3B, an alternating stack of continuous spacer material layers and continuous insulating layers can be formed over the dielectric rail structures 42 and the composite rail structures (14T, 14C, 14B, 27, 314) as stacks of blanket (unpatterned) layers. A continuous insulating cap layer can be formed over the alternating stack of the spacer material layers and the insulating layers. In one embodiment of FIGS. 3A and 3B, the continuous spacer material layers can be continuous electrically conductive layers that remain in a final device structure. In another embodiment, the continuous spacer material layers can be sacrificial material layers that are subsequently replaced electrically conductive layers, as will be described in more detail below.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

Subsequently, the continuous insulating cap layer and the alternating stack of the continuous electrically conductive layers and the continuous insulating layers are patterned to form line stack rail structures. For example, a photoresist layer can be applied over the continuous insulating cap layer, and can be lithographically patterned to mask the areas of the dielectric rail structures 42 while not covering the areas of the composite rail structures (14T, 14C, 14B, 27, 314). In one embodiment, sidewalls of the patterned photoresist layer can be laterally offset from the boundaries between the dielectric rail structures 42 and the composite rail structures (14T, 14C, 14B, 27, 314) to ensure that the entire areas of the composite rail structures (14T, 14C, 14B, 27, 314) are not covered by the patterned photoresist layer.

An anisotropic etch can be performed through the continuous insulating cap layer and the alternating stack of the continuous electrically conductive layers and the continuous insulating layers. Line trenches 69 laterally extending along the first horizontal direction hd1 and laterally spaced apart along the second horizontal direction hd2 can be formed. The line trenches 69 are herein referred to as memory level line trenches. Further, the sacrificial cap structures 314 can be removed from underneath the line trenches 69 to physically expose the top surfaces of the top active regions 14T of the vertical field effect transistors.

The line trenches divide the continuous insulating cap layer and the alternating stack of the continuous electrically conductive layers and the continuous insulating layers into multiple rail structures that extend along the first horizontal direction hd1 and laterally spaced apart along the second horizontal direction hd2. The rail structures are herein referred to as line stack rail structures. Each line stack rail structure overlies a dielectric rail structure 42, extends along the first horizontal direction hd1, and is laterally spaced apart from one another along the second horizontal direction hd2.

Each patterned portion of the continuous insulating cap layer is herein referred to as an insulating cap layer 62, which may be an insulating cap strip. Each patterned portion of the continuous electrically conductive layers is herein referred to as an electrically conductive layer 30 (which may function as word lines), which may be an electrically conductive strip. Each patterned portion of the continuous insulating layer is herein referred to as an insulating layer 60, which may be an insulating strip. As used herein, a "strip" refers to an elongated line, which may have a uniform width throughout or may have laterally protruding or laterally recessed regions. In one embodiment, each of the insulating cap layers 62, the electrically conductive layers 30, and the insulating layers 60 can have a respective uniform width that is invariant along the first horizontal direction hd1. Thus, each line stack rail structure (30, 60, 62) includes an alternating stack of electrically conductive layers 30 and insulating layers 60, and an insulating cap portion 62. In one embodiment, each line stack rail structure (30, 60, 62) can have a lesser width along the second horizontal direction hd2 than the underlying dielectric rail structure 42, and can be entirety within the area of the underlying dielectric rail structure 42.

In one embodiment, the electrically conductive layers 30 comprise a first electrically conductive material. In one embodiment, the first electrically conductive material can be a conductive metal nitride. In one embodiment, the first electrically conductive material can be selected from titanium nitride, tantalum nitride, titanium oxynitride in which a ratio of oxygen atoms to nitrogen atoms is less than 0.1, and tantalum oxynitride in which a ratio of oxygen atoms to nitrogen atoms is less than 0.1. Alternatively, conductive layers 30 may comprise a metal instead of or in addition to a metal nitride. In another embodiment, the first electrically conductive material can include a doped semiconductor material. The insulating layers 60 and the insulating cap portion 62 may comprise any suitable insulating material, such as silicon oxide.

The thickness of the electrically conductive layers 30 can be in a range from 6 nm to 60 nm, although lesser and greater thicknesses can also be employed. The thickness of the insulating lines 60 can be in a range from 6 nm to 60 nm, although lesser and greater thicknesses can also be employed. The thickness of the insulating cap portions 62 can be in a range from 6 nm to 300 nm, although lesser and greater thicknesses can also be employed.

A pair of an electrically conductive layer 30 and an insulating layer 60 can constitute a unit of repetition in the alternating stack (30, 60) of the electrically conductive layers 30 and the insulating layers 60. The total number of repetitions can be in a range from 8 to 1,024, although lesser and greater number of repetitions can also be employed. Thus, a plurality of alternating stacks (30, 60) of insulating layers 60 (which may be insulating strips) and electrically conductive layers 30 (which may be electrically conductive strips) is formed over a substrate 8. Each of the insulating layers 60 and the electrically conductive layers 30 extends along the first horizontal direction (i.e., the word line direction) hd1. The alternating stacks (30, 60) are laterally spaced from one another along the second horizontal direction hd2 (i.e., the global bit line direction).

Figure 4A:
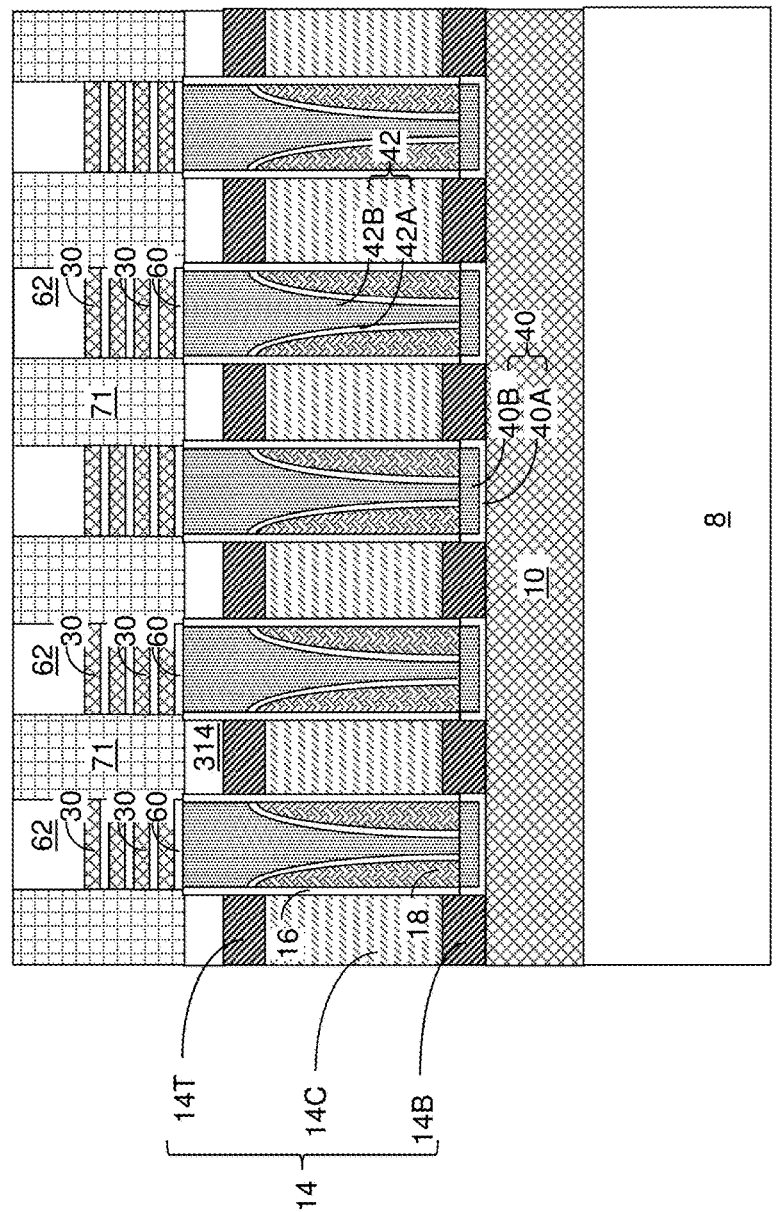
FIG. 4A is a vertical cross-sectional view of the exemplary structure after formation of sacrificial rail structures according to an embodiment of the present disclosure.
Figure 4B:
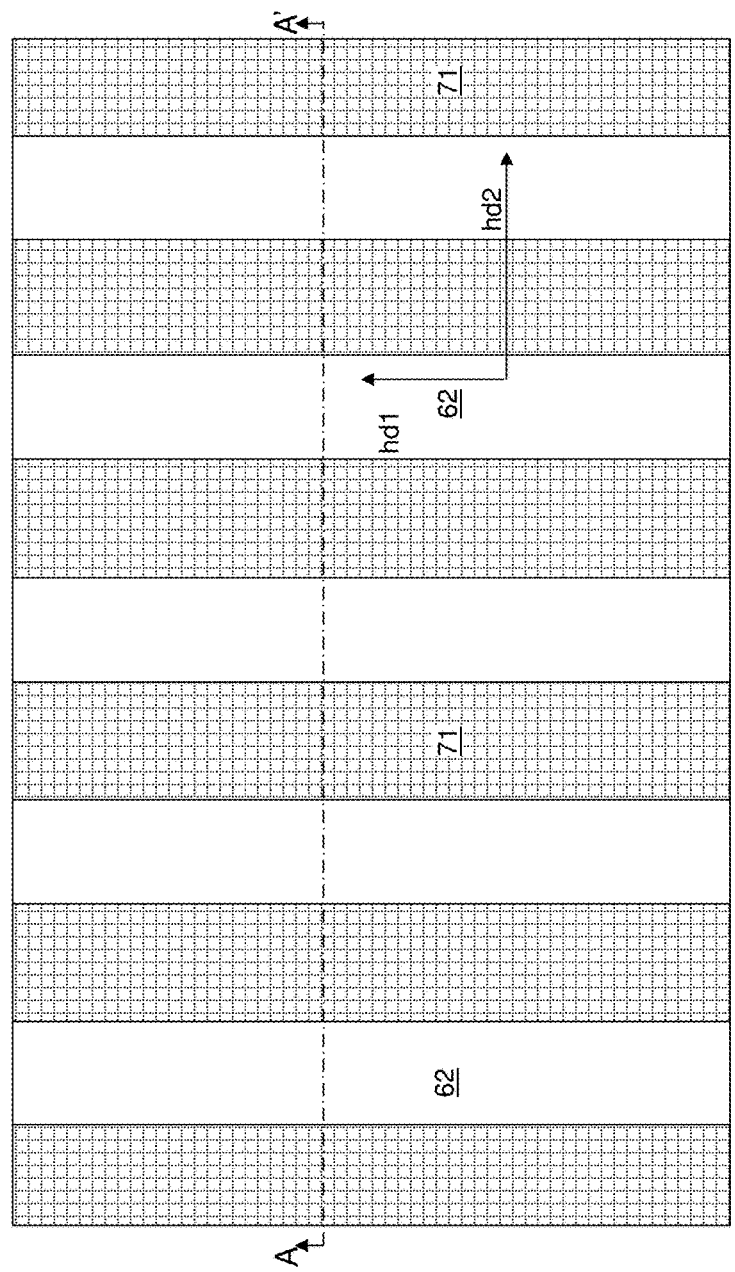
FIG. 4B is a top-down view of the exemplary structure of FIG. 3A. The vertical plane A-A' is the plane of the cross-section for FIG. 3A.

Referring to FIGS. 4A and 4B, a sacrificial material is deposited in the line trenches 69. The sacrificial material is a material that can be removed selective to the materials of the alternating stacks (30, 60), the insulating cap layers 62, the dielectric pillar spacers 27, and the sacrificial cap structures 314. For example, if the insulating layers 60, the insulating cap layers 62, and the dielectric pillar spacers 27 include silicon oxide, and if the sacrificial cap structures 314 include silicon nitride, the sacrificial material can include a semiconductor material such as amorphous silicon, amorphous carbon, diamond-like carbon, or a silicon-based polymer. Excess portions of the sacrificial material can be removed from above the horizontal plane including the top surfaces of the insulating cap layers 62 by a planarization process, which can employ a recess etch and/or chemical mechanical planarization. Each remaining portion of the sacrificial material in the line trenches 69 constitutes sacrificial rail structures 71.

Figure 5A:
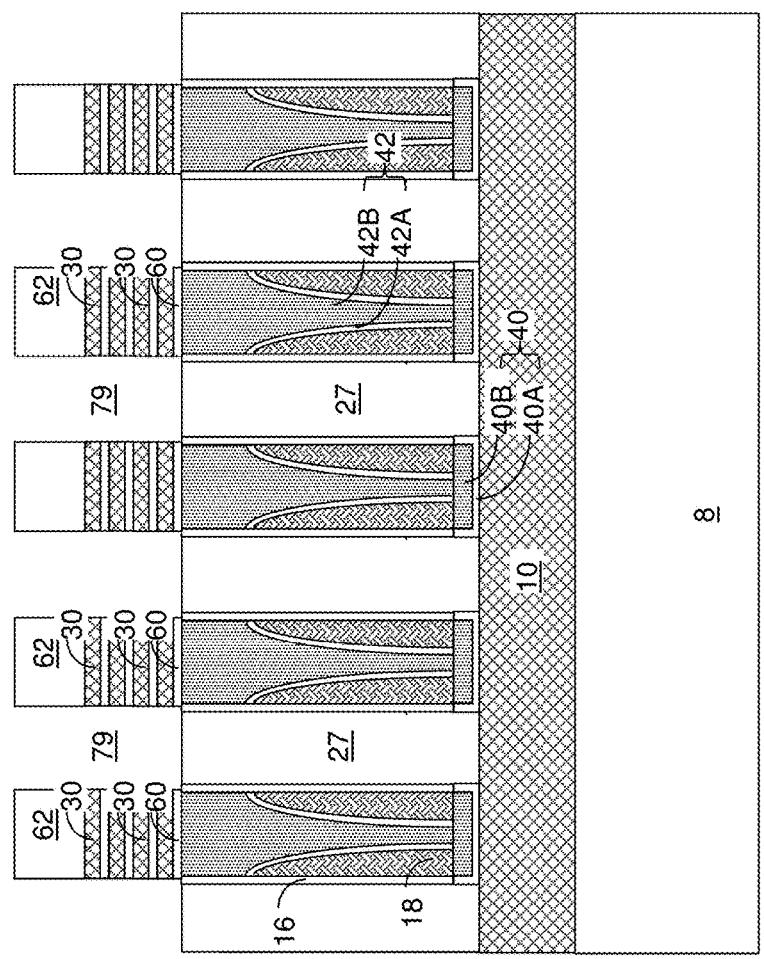
FIG. 5A is a vertical cross-sectional view of the exemplary structure after formation of pillar cavities according to an embodiment of the present disclosure.
Figure 5B:
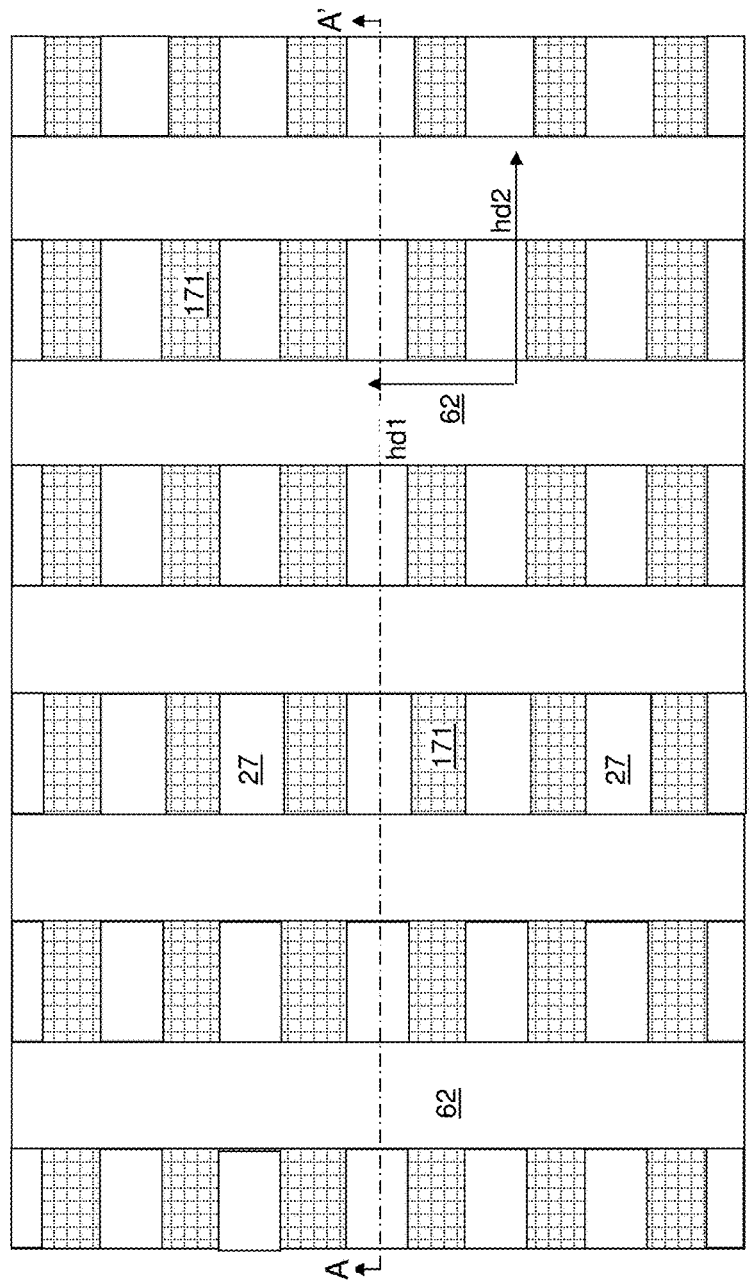
FIG. 5B is a top-down view of the exemplary structure of FIG. 5A. The vertical plane A-A' is the plane of the cross-section for FIG. 5A.

Referring to FIGS. 5A and 5B, a photoresist layer (not shown) can be applied over the insulating cap layers 62 and the sacrificial rail structures 71, and can be lithographically patterned to form a line and space pattern. Line trenches are formed between patterned portions of the photoresist layer such that the line trenches overlie the areas of the dielectric pillar spacers 27, while the patterned portions of the photoresist layer cover the areas of the semiconductor pillar structures (14B, 14C, 14T). An anisotropic etch process that etches the material of the sacrificial rail structures 71 selective to the material of the insulating cap layer 62 can be performed to remove unmasked portions of the sacrificial rail structures 71. Pillar cavities 79 are formed in the volumes from which the material of the sacrificial rail structures 71 is removed by the anisotropic etch. The pillar cavities 79 can have a respective rectangular horizontal cross-sectional shape. The remaining portions of the sacrificial rail structures 71 constitute sacrificial pillar structures 171, which can be arranged as a two-dimensional array.

Figure 6A:
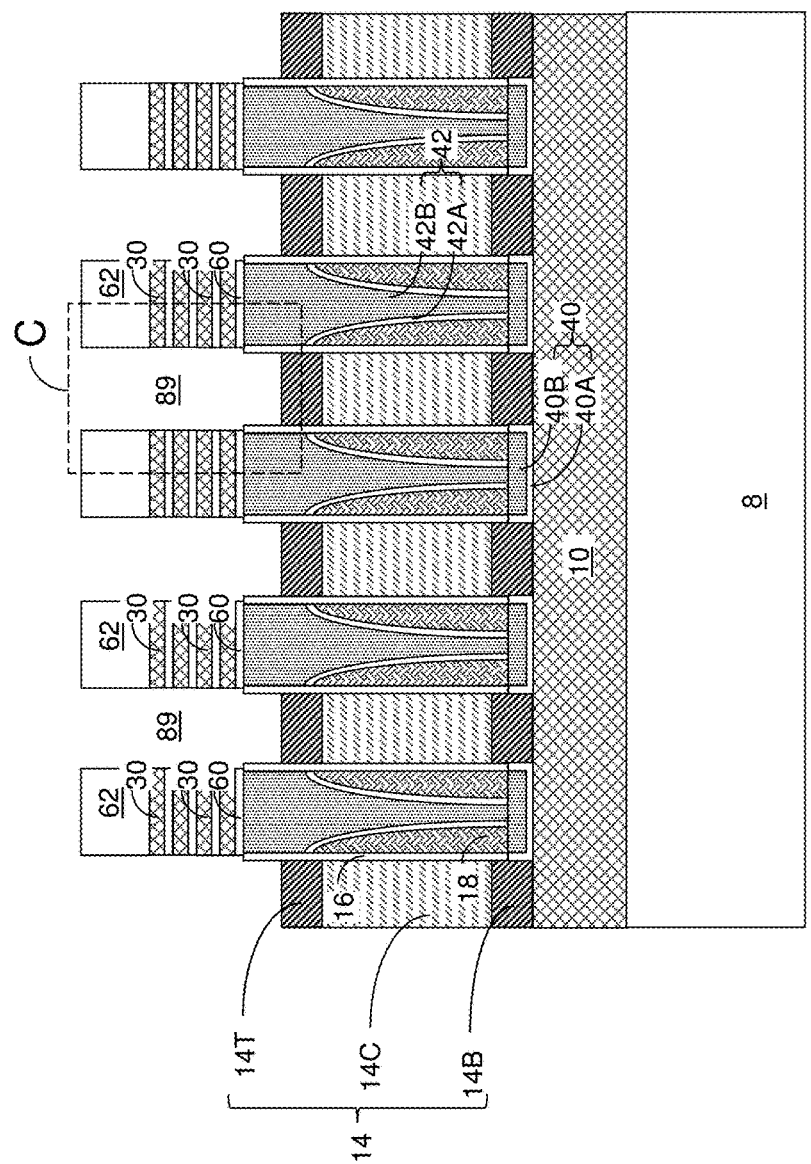
FIG. 6A is a vertical cross-sectional view of the exemplary structure after formation of electrically conductive lines and dielectric pillar structures according to an embodiment of the present disclosure.
Figure 6B:
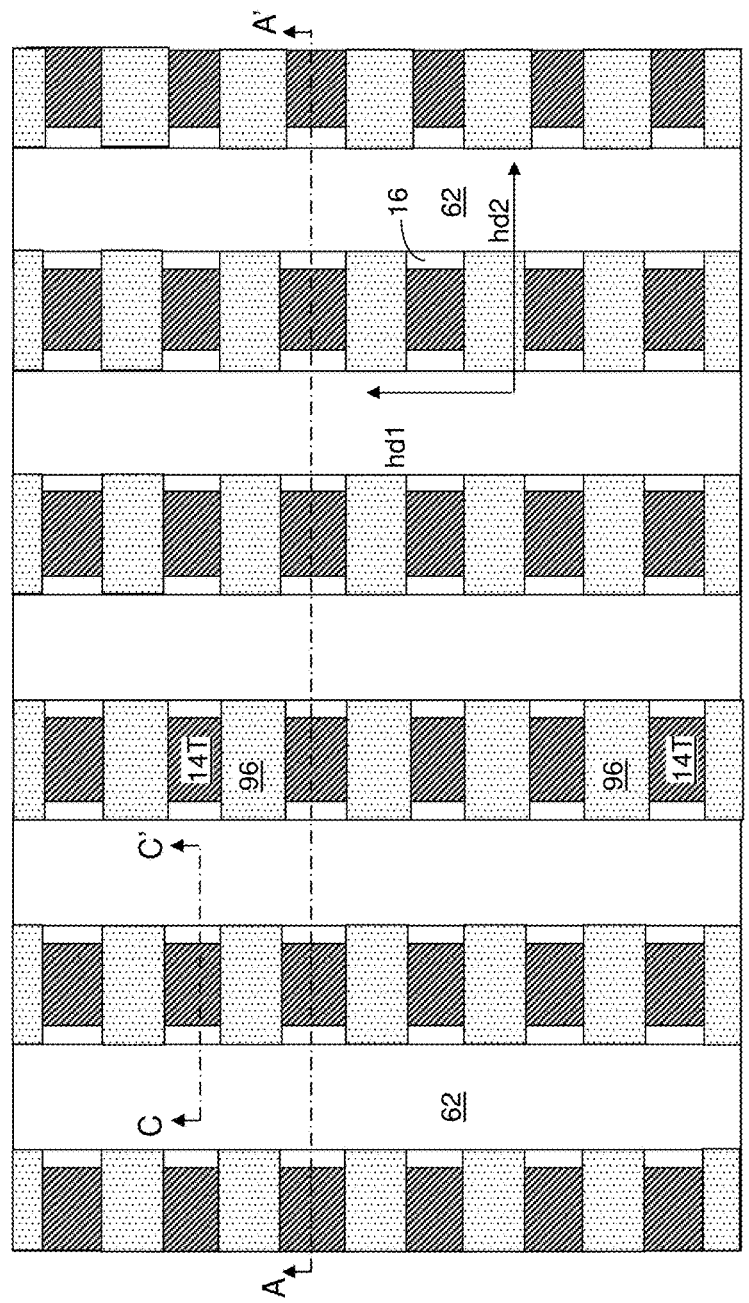
FIG. 6B is a top-down view of the exemplary structure of FIG. 6A. The vertical plane A-A' is the plane of the cross-section for FIG. 6A. The vertical plane C-C' is the plane of the cross-section for FIG. 6C.
Figure 6C:
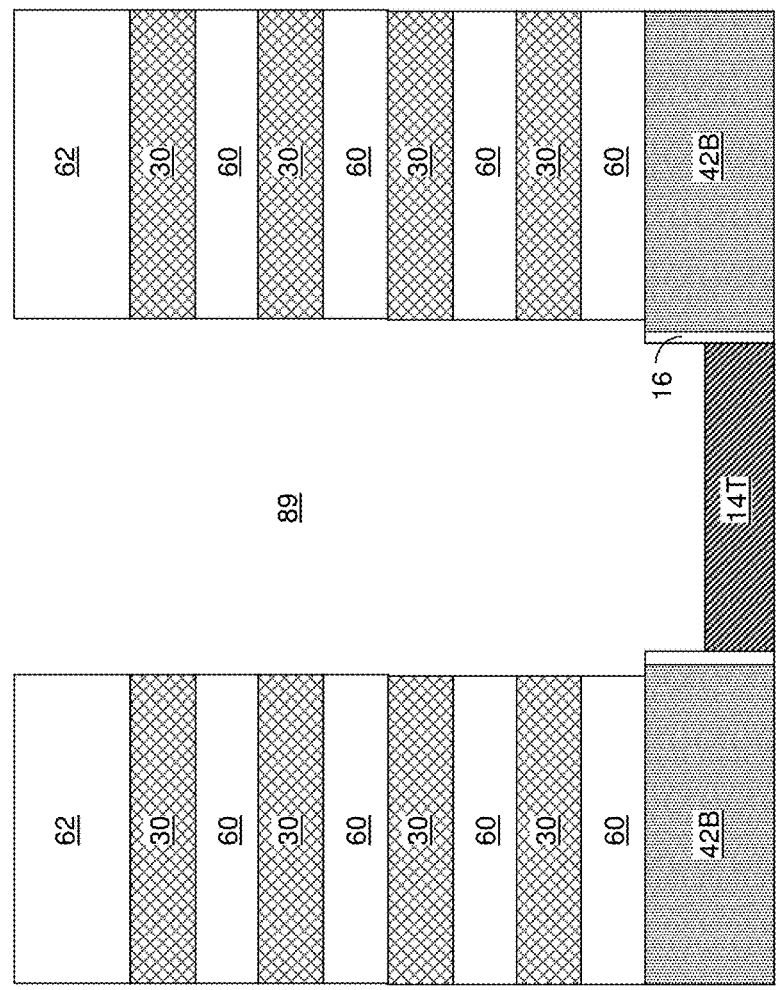
FIG. 6C is a magnified vertical cross-sectional view of a memory array region of the exemplary structure of FIGS. 6A and 6B.

Referring to FIGS. 6A-6C, a dielectric material such as silicon oxide is deposited in the pillar cavities 79. The dielectric material can be deposited by a conformal deposition method or by spin-coating. Excess portions of the dielectric material can be removed from above the horizontal plane including the top surfaces of the insulating cap layers 62 by a planarization process, which can employ a recess etch and/or chemical mechanical planarization. Remaining portions of the dielectric material in the pillar cavities 79 constitute dielectric pillar structures 96, which can be arranged as a two-dimensional periodic array. The two-dimensional array of the sacrificial pillar structures 171 and the two-dimensional array of the dielectric pillar structures 96 can be laterally offset with respect to each other by about one half of the pitch of each two-dimensional array along the first horizontal direction hd1.

Subsequently, the material of the two-dimensional array of the sacrificial pillar structures 171 can be removed selective to the materials of the two-dimensional array of the dielectric pillar structures 96, the insulating cap layers 62, and the alternating stacks (30, 60). For example, if the sacrificial material of the two-dimensional array of the sacrificial pillar structures 171 includes amorphous silicon, a wet etch employing a trimethyl-2 hydroxyethyl ammonium hydroxide (TMY) solution or a KOH solution may be employed to remove the two-dimensional array of the sacrificial pillar structures 171. A two-dimensional array of memory openings 89 can be formed in the volumes from which the sacrificial pillar structures 171 are removed. Each memory opening 89 can have a substantially rectangular horizontal cross-sectional shape.

Subsequently, the sacrificial cap structures 314 can be removed from underneath the memory openings 89, for example, by an isotropic etch or an anisotropic etch. The isotropic or anisotropic etch can recess the sacrificial cap structures 314 at least until the top surfaces of the semiconductor pillars 14 are physically exposed. In an illustrative example, if the sacrificial cap structures 314 include silicon nitride, a wet etch employing hot phosphoric acid can be employed. If the sacrificial cap structures 314 include organosilicate glass, a wet etch employing dilute hydrofluoric acid can be employed. The memory openings 89 can be vertically extended by removing the sacrificial cap structures 314.

The above described process illustrated in FIGS. 2A to 6C to form the alternating stack of electrically conductive layers (e.g., ReRAM word lines) 30 and insulating layers 60 and the select transistors (14, 16, 18) is optional. Any other suitable process may be used instead. For example, the select transistors (14, 16, 18) may be formed by any suitable method followed by forming the alternating stack (60, 30) over the substrate 8. The alternating stack (60, 30) is then photolithographically patterned and etched (e.g., reactively ion etched) to form memory openings 89 through the alternating stack (60, 30) to arrive at the structure shown in FIG. 6C. If desired, region 14T does not have to be recessed compared to the gate dielectric 16, as shown in FIG. 6C.

Figure 7A:
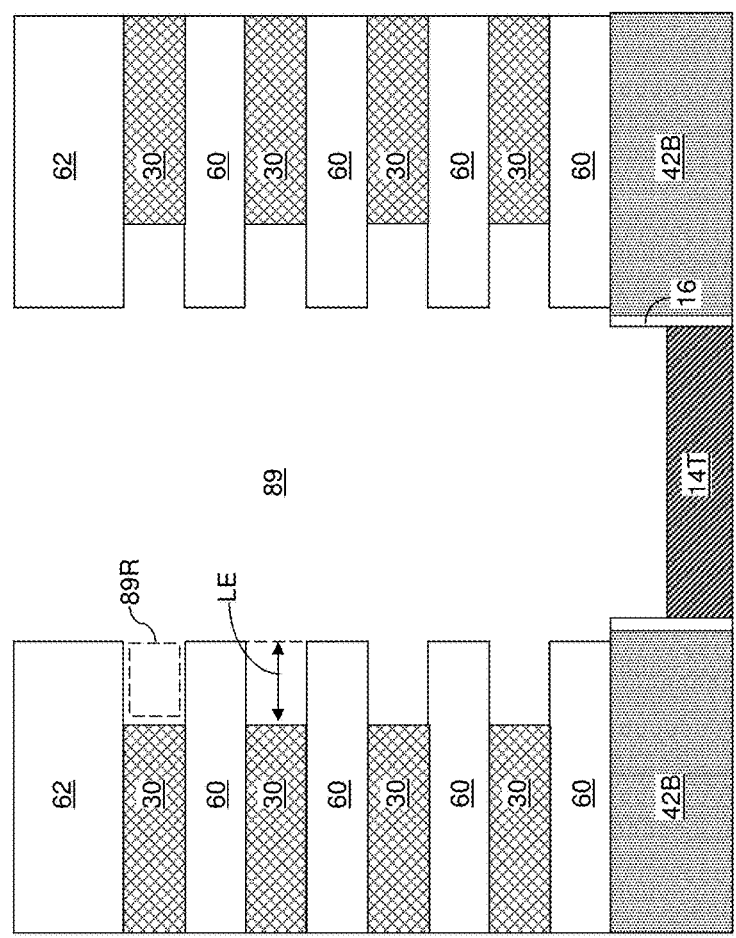
FIG. 7A is a vertical cross-sectional view of the memory array region of the exemplary structure after laterally recessing electrically conductive layers to form laterally recessed regions according to an embodiment of the present disclosure.

Referring to FIG. 7A, sidewalls of the electrically conductive layers 30 can be laterally recessed from the periphery of each memory opening 89 by an isotropic etch that etches the material of the electrically conductive layers 30 selective to the materials of the insulating layers 60, the insulating cap layers 62, the dielectric rail fill material portions 42B of the dielectric rail structure 42, and the top active regions 14T. For example, a wet etch process that employs a mixture of hydrofluoric acid, nitric acid, and optionally hydrogen peroxide and/or hydrochloric acid can be employed to etch the material of the electrically conductive layers 30 selective to other physically exposed materials of the exemplary structure.

The sidewalls of the electrically conductive layers 30 are laterally recessed relative to the sidewalls of the insulating layers 60 around each memory opening 89. The duration of the isotropic etch process can be selected such that the lateral extent LE of each laterally recessed region 89R can be in a range from 30% to 600%, such as from 75% to 300%, of the thickness of the electrically conductive layers 30. For example, the lateral extent LE of each laterally recessed region 89R can be in a range from 4 nm to 100 nm, such as from 6 nm to 40 nm.

Figure 7B:
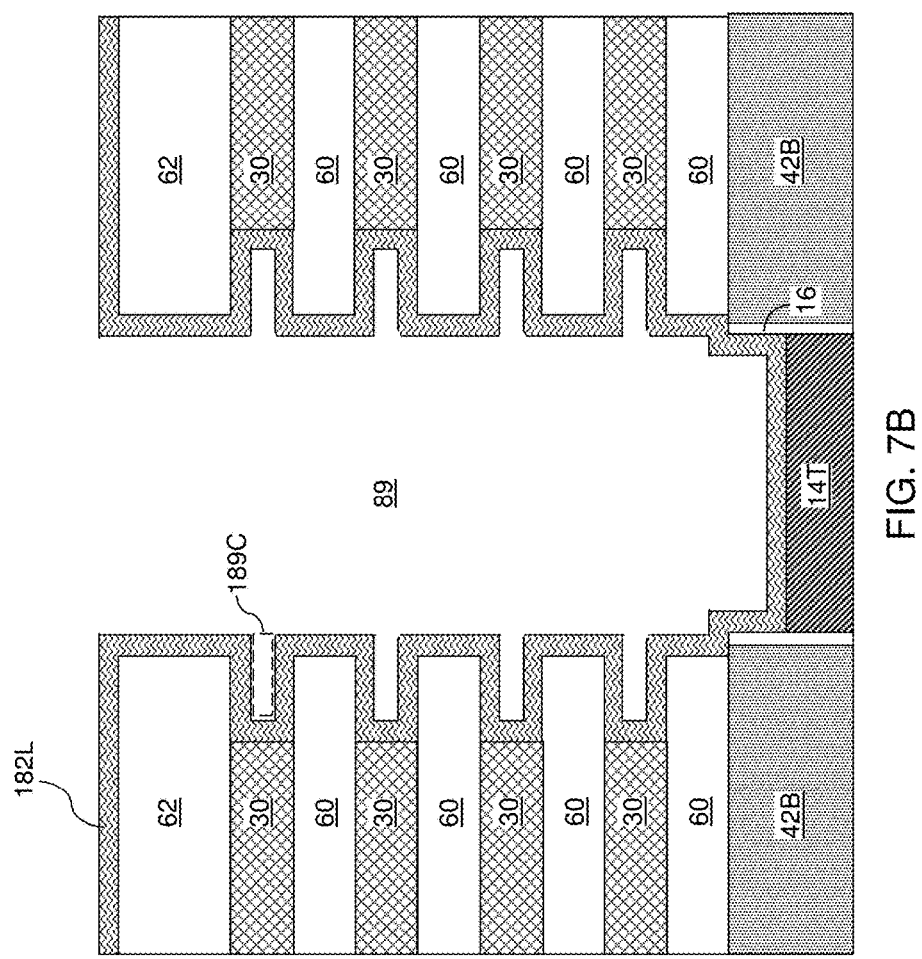
FIG. 7B is a vertical cross-sectional view of the memory array region of the exemplary structure after deposition of a conformal barrier material layer according to an embodiment of the present disclosure.

Referring to FIG. 7B, a conformal barrier material layer 182L can be deposited within the volumes of each laterally recessed region 89R and on the physically exposed sidewalls of the insulating layers 60 and the insulating cap layers 62 by a conformal deposition process. As used herein, a "barrier material" is an insulating material or a semiconductor material that is provided with a suitable thickness to provide an energy barrier for conduction of electrical current therethrough. Generally, a barrier material composed of an insulating material has a small thickness (which may be, for example, in a range from 1 nm to 2 nm) in order to provide sufficient tunneling current under an electrical bias thereacross, and a barrier material composed of a semiconductor material has a greater thickness (which may be in a range from 2 nm to 20 nm depending on the conductivity that can be modulated by doping with electrical dopants) in order to limit the electrical current therethrough under an electrical bias thereacross.

In one embodiment, the thickness of the conformal barrier material layer 182L is selected such that the total thickness (i.e., total height) of the layer 182L does not completely fill each laterally recessed region 89R and a lateral cavity 189C remains in the layer 182L in each laterally recessed region 89R outside the vertical planes of the memory opening 89.

Preferably, the thickness (i.e., height) of the lateral cavity 189C is at least 4 nm, such as 4 to 25 nm. Preferably, each of the thickness, length and width of the lateral cavity 189C is at least 4 nm, such as 4 to 25 nm. For example, the difference between the thickness of each electrically conductive layer 30 and two times the thickness of conformal barrier material layer 182L is 4 nm or greater, such as 4 to 25 nm.

In one embodiment, the conformal barrier material layer 182L comprises a material selected from amorphous carbon, diamond-like carbon (DLC), an amorphous semiconductor material, and a polycrystalline semiconductor material. In one embodiment, the conformal barrier material layer 182L can include undoped amorphous silicon or doped amorphous silicon having electrical conductivity less than $1.0 \times 10^{-3}$ S/cm, although greater electrical conductivity may be employed provided that the thickness of the conformal barrier material layer 182L increases correspondingly.

Figure 7C:
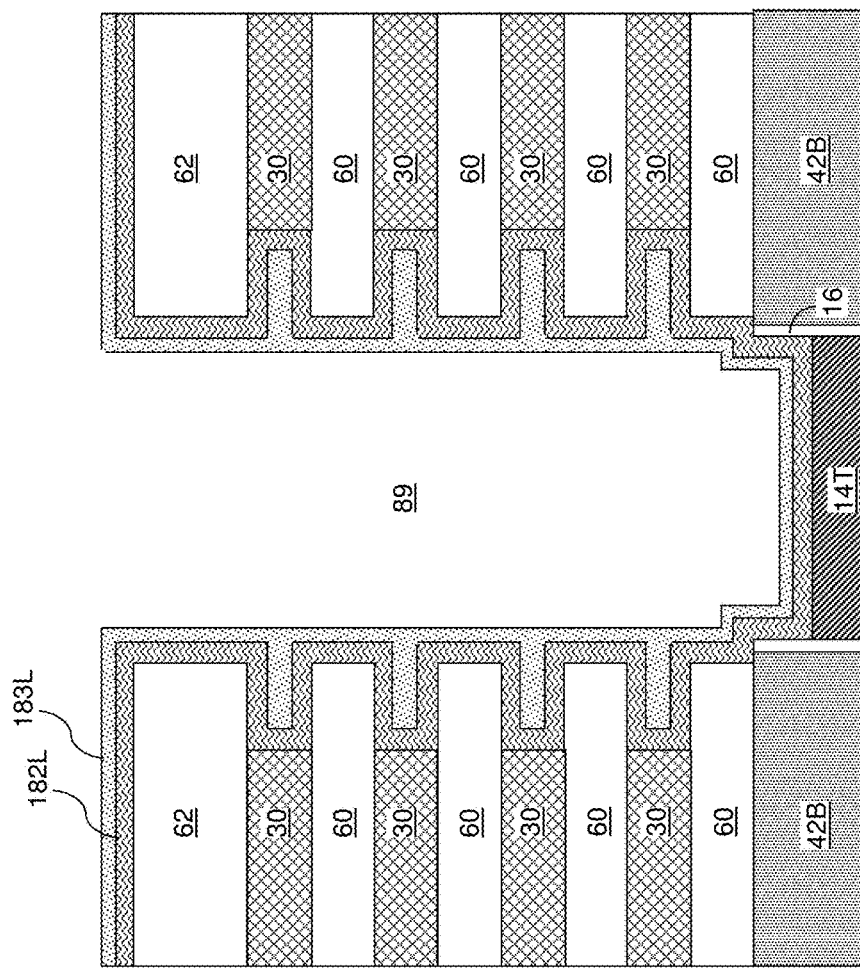
FIG. 7C is a vertical cross-sectional view of the memory array region of the exemplary structure after deposition of an amorphous precursor memory material layer according to an embodiment of the present disclosure.

Referring to FIG. 7C, an amorphous precursor memory material layer 183L is deposited employing a conformal deposition process (such as low pressure chemical vapor deposition or atomic layer deposition). The amorphous precursor memory material layer 183L is deposited in the lateral cavities 189C and over the conformal barrier material layer 182L. Thus, the amorphous precursor memory material layer 183L is deposited in the unfilled volumes of the lateral cavities 189C. The amorphous precursor memory material layer 183L preferably completely fills the lateral cavities 189C, such as that the combined thickness (i.e., height) of the amorphous precursor memory material layer 183L in the lateral cavities 189C is at least 4 nm, such as 4 to 25 nm.

The amorphous precursor memory material layer 183L includes an amorphous precursor material that can be converted into a resistive memory material upon crystallization. The uncrystallized amorphous material itself of the amorphous precursor memory material layer 183L may, or may not, be a resistive memory material. As used herein, a "resistive memory material" or a "reversibly resistance-switching material" is a material whose resistivity can be altered by application of an electrical bias voltage across the material. As used herein, a "resistive memory material layer" refers to a layer including a resistive memory material. As used herein, a "resistive memory element" or "resistive memory portion" refers to a portion of a resistive memory material in one memory cell.

In one embodiment, the amorphous precursor memory material layer 183L can include an amorphous metal oxide material that can be converted into a crystalline metal oxide material that is a resistive memory material. In one embodiment, the amorphous precursor memory material layer 183L can include a non-stoichiometric or a stoichiometric amorphous titanium oxide. In one embodiment, the amorphous precursor memory material layer 183L is a slightly sub-stoichiometric titanium oxide having a formula $TiO_{2-\delta}$, where value of $\delta$ can be selected from 0 to 0.5, such as greater than zero to 0.15 (i.e., to form a sub-stoichiometric, oxygen deficient metal oxide). For example, the sub-stoichiometric titanium oxide has less than two oxygen atoms for each titanium atom. In one embodiment, the titanium oxide may have a high concentration of free electrons in thermodynamic equilibrium in a range from $1.0 \times 10^{20}/cm^3$ to $1.0 \times 10^{21}/cm^3$.

The inventors of the present disclosure discovered that crystallization of amorphous precursor memory materials can depend on at least one dimension, such as at least the thickness of the amorphous precursor memory material. Specifically, for a given crystallization anneal process at an elevated temperature, an amorphous precursor memory material can have at least one critical dimension, such as a critical thickness below which crystallization does not proceed, and above which crystallization proceeds.

According to an aspect of the present disclosure, the total thickness of portions of the amorphous precursor memory material layer 183L located in the lateral cavities 189C is greater than the total thickness of layer 183L located over the vertical (or substantially vertical) sidewalls of the insulating layers 60 in the memory opening 89. In one embodiment, the total thickness of portions of the amorphous precursor memory material layer 183L located in the lateral cavities 189C is greater than the critical thickness. In contrast, the total thickness of portions of the amorphous precursor memory material layer 183L located outside the lateral cavities 189C over the sidewalls of the insulating layers 60 in the memory opening 89 is less than the critical thickness. In another embodiment, each of the total thickness, length and width of portions of the amorphous precursor memory material layer 183L located in the lateral cavities 189C is greater than the critical thickness. In contrast, each of the total thickness, length and width of portions of the amorphous precursor memory material layer 183L located outside the lateral cavities 189C over the sidewalls of the insulating layers 60 in the memory opening 89 is less than the critical thickness. Further, the total thickness of the amorphous precursor memory material layer 183L can greater than the height of the lateral cavities 189C such that the amorphous precursor memory material layer 183L completely fills the lateral cavities 189C.

Figure 7D:
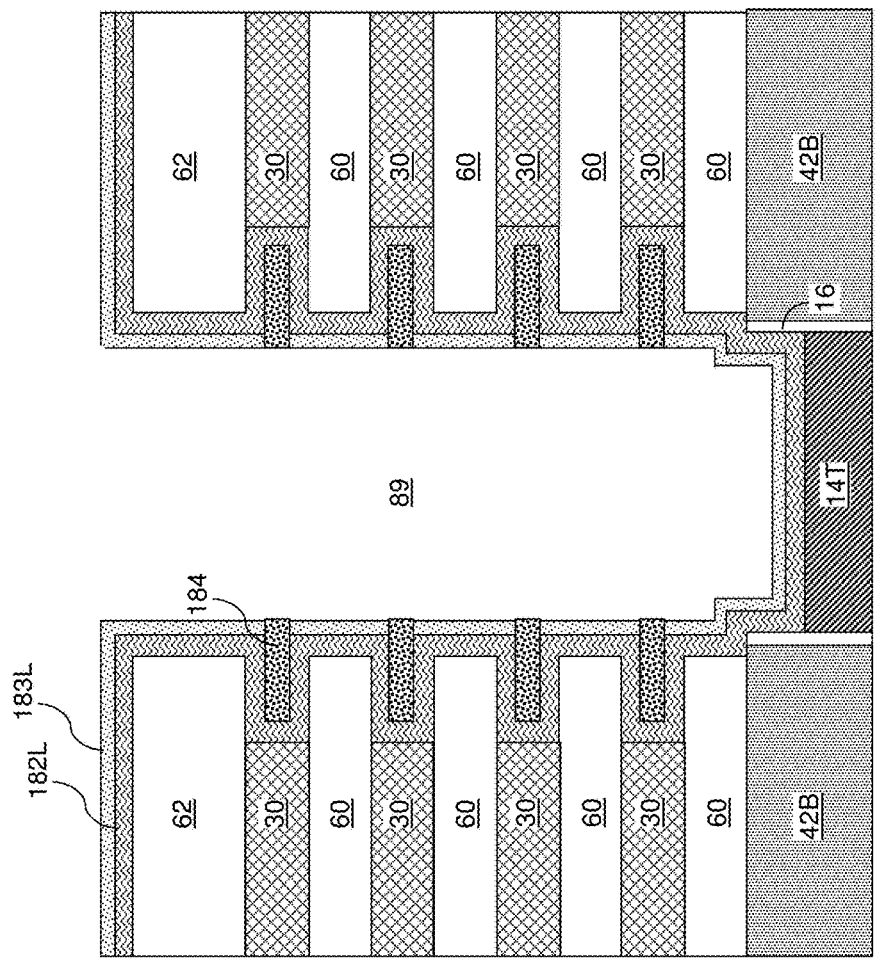
FIG. 7D is a vertical cross-sectional view of the memory array region of the exemplary structure after an anneal process that converts portions of the amorphous precursor memory material layer within lateral cavities into crystalline memory material portions according to an embodiment of the present disclosure.

Referring to FIG. 7D, a crystallization anneal is performed at an elevated temperature, such as at least 475° C., such as 475 to 600° C., for example, 500 to 525° C., for 20 to 60 seconds, such as 30 to 45 seconds. Horizontal portions of the amorphous precursor memory material layer 183L located in the lateral cavities 189C are selectivity crystallized into crystalline memory material portions 184. In contrast, the vertical portions of the amorphous precursor memory material layer 183L located in the memory opening over the sidewalls of the insulating layers 60 are not crystallized and remain amorphous.

In other words, a critical thickness is a thickness below which crystallization of the amorphous material of the amorphous precursor memory material layer 183L does not occur and above which crystallization of the amorphous material of the amorphous precursor memory material layer 183L does occur. The as-deposited thickness of the amorphous precursor memory material layer 183L can be selected to be greater than one half of the critical thickness and to be less than the critical thickness. Further, the height of the lateral cavities 189C is selected to be greater than the critical thickness, and equal to, or less than, double the thickness of the amorphous precursor memory material layer 183L.

The portions of the amorphous precursor memory material layer 183L that fill the lateral cavities 189C have a total (i.e., combined) thickness that is greater than the critical thickness because the amorphous precursor material grows from an upper surface overlying each lateral cavity 189C and from a lower surface underlying each lateral cavity 189C to form a merged portion having a total thickness greater than the critical thickness. The portions of the amorphous precursor memory material layer 183L located outside the lateral cavities 189C have a total (i.e., as-deposited) thickness that is less than the critical thickness. Thus, only the portions of the amorphous precursor memory material layer 183L located within the volumes of the lateral cavities 189C are converted into crystalline memory material portions 184, which comprise a resistive memory material. The portions of the amorphous precursor memory material layer 183L located outside the volumes of the lateral cavities 189C remain amorphous during and after the anneal process. Thus, only portions of the amorphous precursor memory material layer 183L within the volumes of the laterally recessed regions 89R are converted into the crystalline memory material portions 184. In one embodiment, the crystalline memory material portions 184 can include crystalline (e.g., single crystalline or polycrystalline) titanium oxide portions having a sub-stoichiometric composition.

Figure 7E:
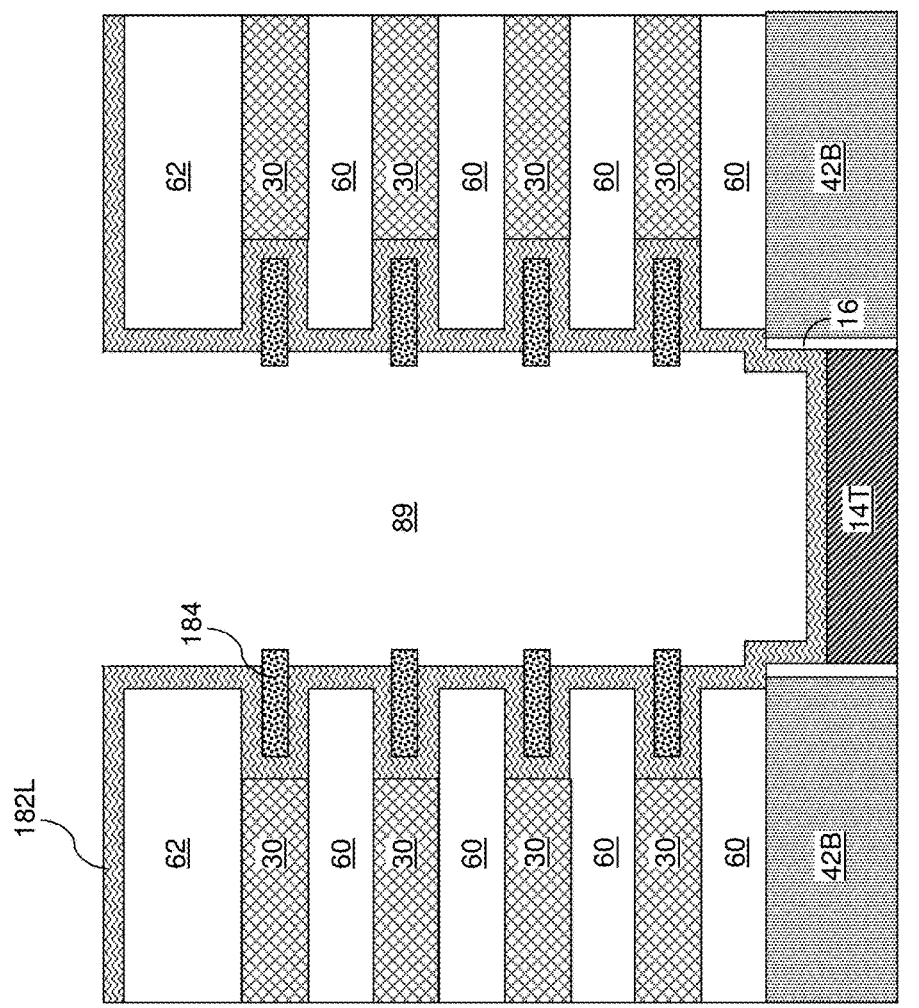
FIG. 7E is a vertical cross-sectional view of the memory array region of the exemplary structure after removal of remaining portions of the amorphous precursor memory material layer selective to the crystalline memory material portions according to an embodiment of the present disclosure.

Referring to FIG. 7E, the remaining amorphous portions of the amorphous precursor memory material layer 183L are removed selective to the crystalline memory material portions 184 by an isotropic etch process. For example, a wet etch process that provides a wet etch selectivity greater than 5 for the amorphous portions of the amorphous precursor memory material layer 183L relative to the crystalline memory material portions 184 can be employed. If the crystalline memory material portions 184 include crystalline titanium oxide, the amorphous titanium oxide material of the amorphous precursor memory material layer 183L can be removed by a wet etch process employing buffered hydrofluoric acid, hot sulfuric acid or a mixture thereof. A surface portion of each crystalline memory material portions 184 may be collaterally etched due to the finite selectivity of the wet etch process. In one embodiment, each crystalline memory material portion 184 may optionally protrude inward into the memory openings 89 from vertical planes including the inner surfaces of the conformal barrier material layer 182L.

Figure 7F:
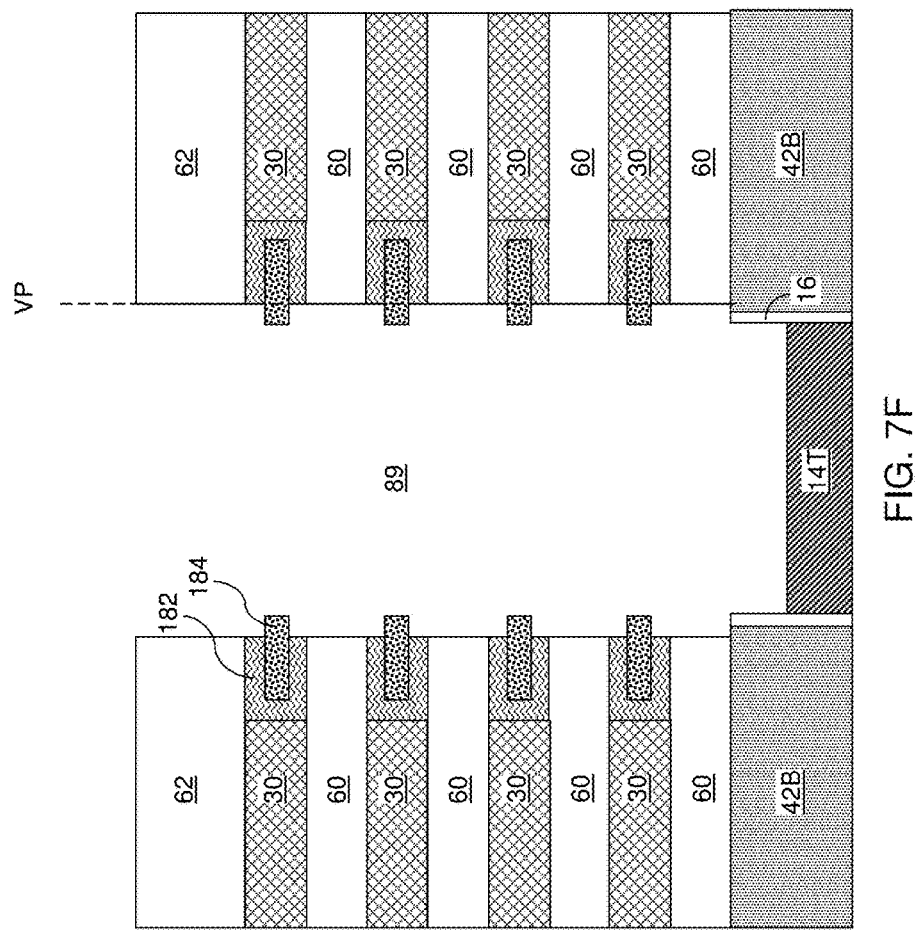
FIG. 7F is a vertical cross-sectional view of the memory array region of the exemplary structure after removal of physically exposed portions of the barrier material layer and formation of clam shaped barrier material portions according to an embodiment of the present disclosure.

Referring to FIG. 7F, physically exposed portions of the conformal barrier material layer 182L can be removed selective to the crystalline memory material portions 184 by an isotropic etch. For example, if the conformal barrier material layer 182L includes amorphous silicon, a wet etch employing a trimethyl-2 hydroxyethyl ammonium hydroxide (TMY) solution or a KOH solution may be employed to remove the portions of the conformal barrier material layer overlying the sidewalls of the insulating layers 60, the sidewalls and the top surface of the insulating cap layers 62, and the top surfaces of the top active regions 14T. The top surfaces of the top active regions 14T may be collaterally vertically recessed during removal of the physically exposed portions of the conformal barrier material layer 182L.

The remaining portions of the conformal barrier material layer 182L in the laterally recessed regions 89R constitute clam shaped barrier material portions 182 that embeds a respective one of the crystalline memory material portions 184 therein. As used herein, a "clam shaped" element refers to an element that includes a vertical portion that extends vertically, an upper horizontal portion that is adjoined to an upper end of the vertical portion and extends horizontally, and a lower horizontal portion that is adjoined to a lower end of the vertical portion and extends horizontally. In one embodiment, the vertical portion, the upper horizontal portion, and the lower horizontal portion of each clam shaped barrier material portion 182 can have the same thickness. In one embodiment, the upper horizontal portion and the lower horizontal portion of each clam shaped barrier material portion 182 can have the same lateral extent. In one embodiment, the outer sidewalls of each clam shaped barrier material portion 182 in the memory opening 89 may be at, or in proximity to, a vertical plane VP including the inner sidewalls of the insulating layers 60 in the memory opening 89.

Figure 7G:
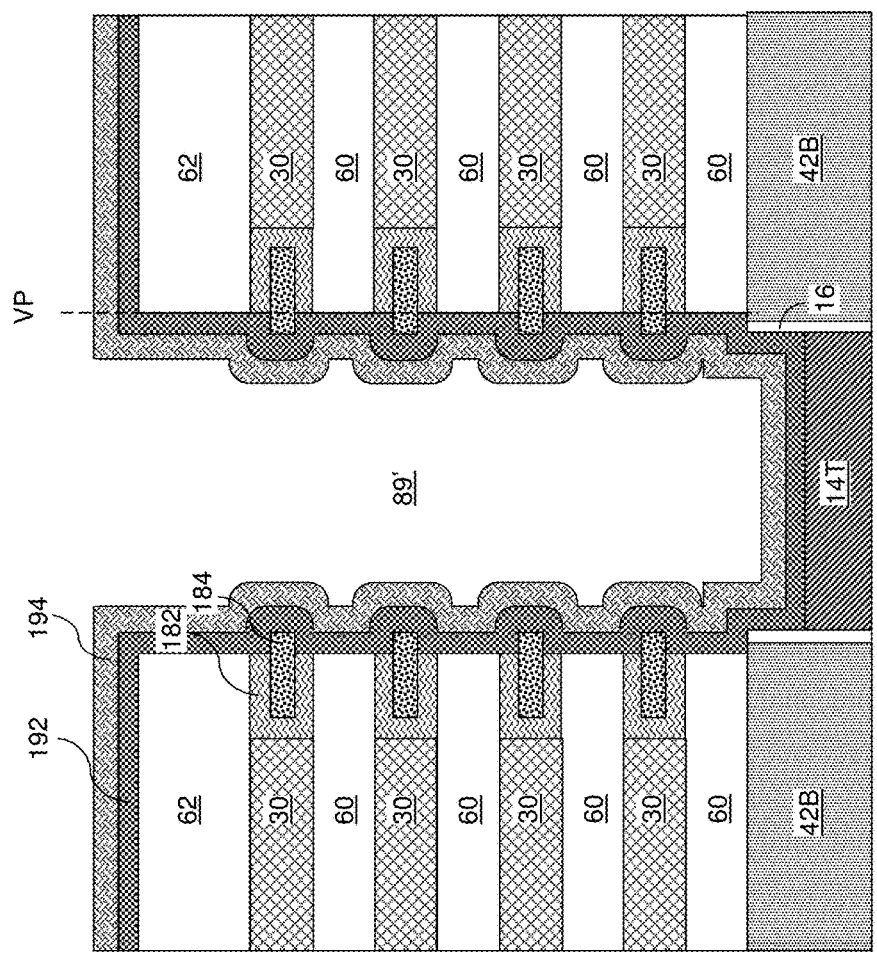
FIG. 7G is a vertical cross-sectional view of the memory array region of the exemplary structure after deposition of a conductive metallic nitride layer and a doped semiconductor material layer according to an embodiment of the present disclosure.

Referring to FIG. 7G, a conductive metallic nitride layer 192 can be deposited on the surfaces of the crystalline memory material portions 184 and the clam shaped barrier material portions 182 by a conformal deposition process. The conductive metallic nitride layer 192 includes a conductive metallic nitride material such as TiN, TaN, WN, or a combination thereof. The thickness of the conductive metallic nitride layer 192 can be in a range from 3 nm to 30 nm, although lesser and greater thicknesses can also be employed. The inner sidewalls and the outer sidewalls of the conductive metallic nitride layer 192 can follow the general contour of the sidewalls of the insulating layers 60 and the clam shaped barrier material portion 182 and the protruding surfaces of the crystalline memory material portions. Thus, the inner sidewalls and the outer sidewalls of the conductive metallic nitride layer 192 can have a vertically undulating profile, i.e., a generally vertically extending profile with lateral shifting in position as a function of a vertical distance from a substrate.

Subsequently, a semiconductor material layer 194 can be deposited on the conductive metallic nitride layer 192 by a conformal deposition method such as chemical vapor deposition. The semiconductor material layer 194 includes a semiconductor material such as amorphous silicon, a silicon-germanium alloy, or any other semiconductor material. The semiconductor material layer 194 may, or may not, be doped. If doped, the semiconductor material layer 194 can have a same type of doping as the top active regions 14T of the vertical semiconductor transistors. In one embodiment, the thickness of the semiconductor material layer 194 can be in a range from 3 nm to 100 nm, although lesser and greater thicknesses can also be employed. In one embodiment, the semiconductor material layer 194 can be heavily doped and conductive, i.e., has electrical conductivity greater than $1.0 \times 10^5$ S/cm. Each unfilled volume of the memory opening 89 forms a memory cavity 89'.

Figure 7H:
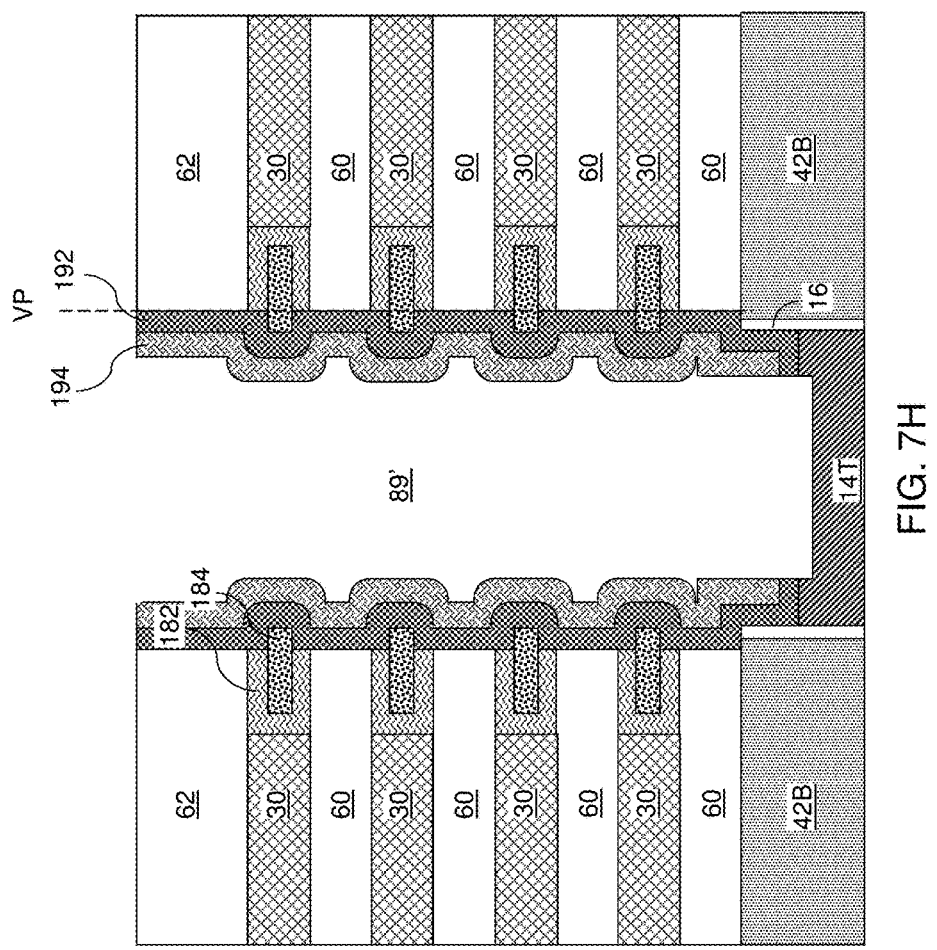
FIG. 7H is a vertical cross-sectional view of the memory array region of the exemplary structure after physically exposing a top active region of an underlying vertical field effect transistor according to an embodiment of the present disclosure.
Figure 71:
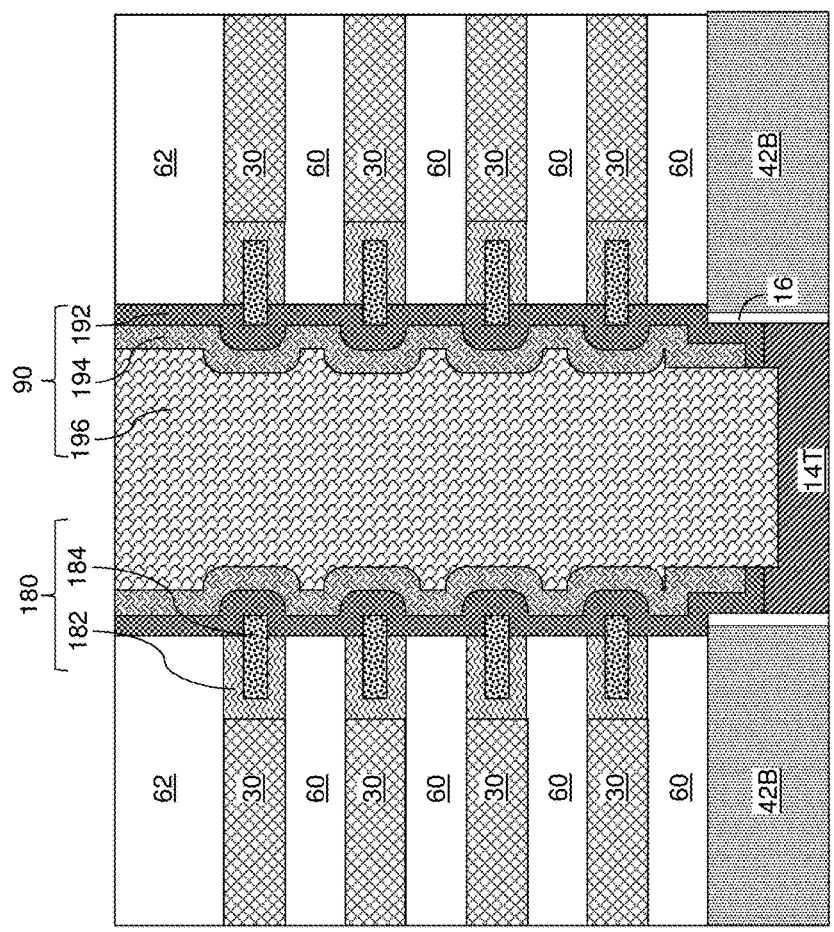

Referring to FIG. 7H, an anisotropic etch is performed to remove horizontal portions of the semiconductor material layer 194 and the conductive metallic nitride layer 192. An opening is formed through the semiconductor material layer 194 and the conductive metallic nitride layer 192 at the bottom of each memory cavity 89', and a top surface of an underlying top active region 14T can be physically exposed. Each remaining portion of the semiconductor material layer 194 and the conductive metallic nitride layer 192 within a memory opening 89 constitutes a hollow electrode (192, 194), in which the conductive metallic nitride layer 192 laterally surrounds the semiconductor material layer 194.

Figure 8A:
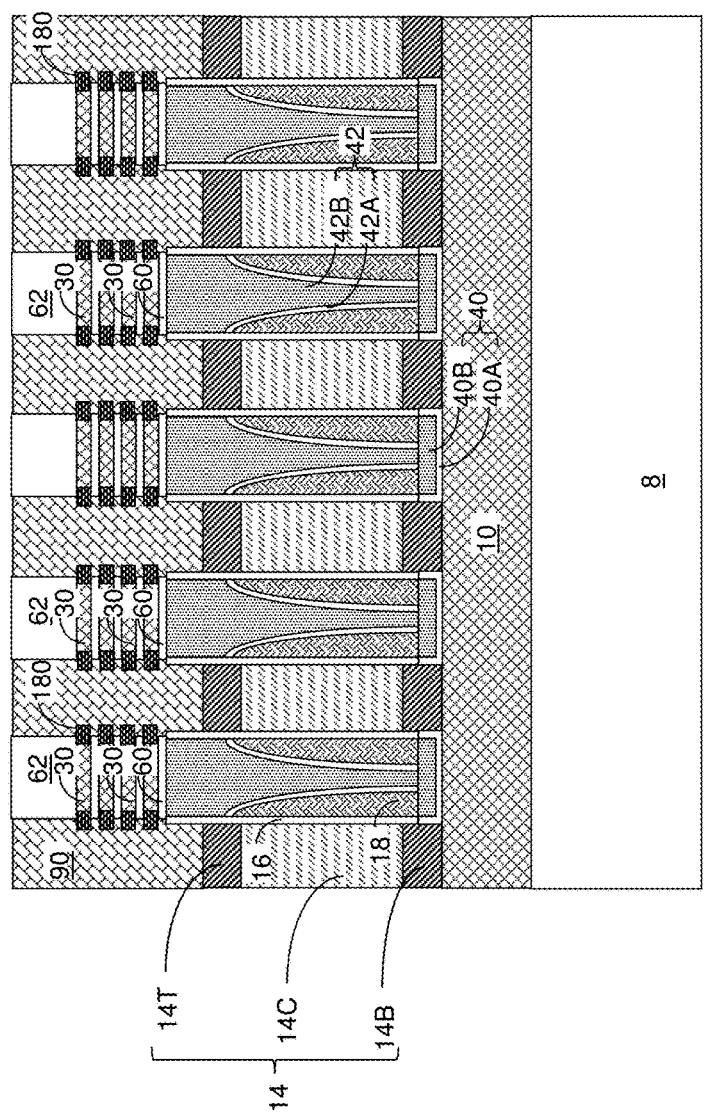
FIG. 8A is a vertical cross-sectional view of the exemplary structure after formation of the vertical bit lines according to an embodiment of the present disclosure.
Figure 8B:
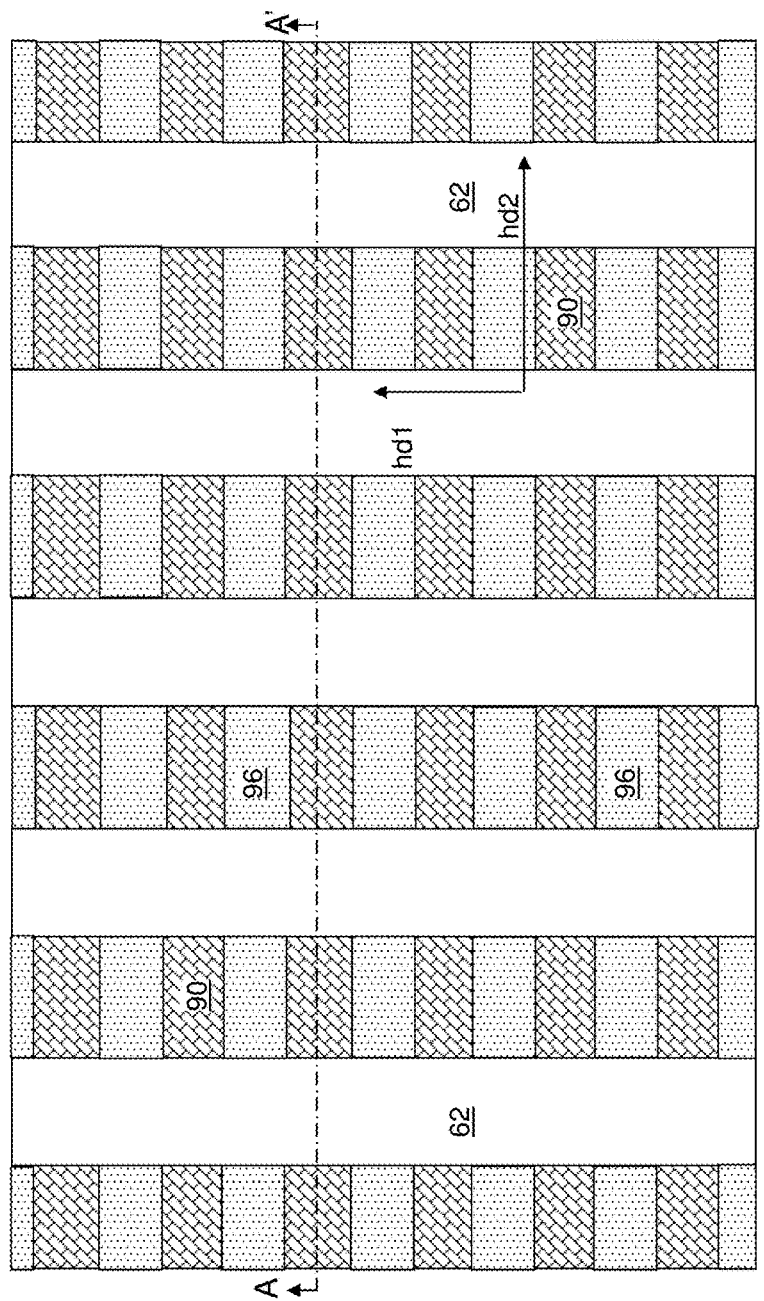
FIG. 8B is a top-down view of the exemplary structure of FIG. 8A. The vertical plane A-A' is the plane of the cross-section for FIG. 8A.

Referring to FIGS. 7I, 8A, and 8B, a semiconductor material can be deposited to fill the memory cavities 89'. Excess portions of the semiconductor material can be removed by a planarization process such as chemical mechanical planarization (CMP) and/or a recess etch. A semiconductor material portion 196 is formed within the volume of each memory cavity 89'. The semiconductor material portion 196 can include amorphous silicon, polysilicon, or other doped semiconductor material. Optionally, the semiconductor material portions 196 can be in-situ doped with dopants of the same conductivity type as the top active regions 14T.

The conductive metallic nitride layer 192, the semiconductor material layer 194, and the semiconductor material portion 196 form a vertically conductive structure (after a suitable anneal as needed), which is herein referred to as a vertical conductive line 90 (e.g., local vertical bit line (VBL)). The vertical conductive line 90 may contact the top source or drain region 14T of the respective underlying select transistor (14, 16, 18). Each adjoining pair of a crystalline memory material portions 184 and a clam shaped barrier material portions 182 forms a discrete resistive memory element 180 of a ReRAM memory cell. Each memory element 180 is physically separated from and does not contact other memory elements 180 in the same memory opening 89.

The vertical conductive line 90 is formed on a set of crystalline memory material portions 180 that are arranged as two vertical stacks. The vertical conductive line 90 is formed on top surfaces and bottom surfaces of laterally protruding portions of the crystalline memory material portions 184 and on the sidewalls of the insulating layers 60. The vertical conductive line 90 can comprise a conductive metallic nitride layer 192 that contacts the crystalline memory material portions 184 and having a laterally undulating vertical cross-sectional profile, i.e., a laterally undulating profile that is present within a vertical cross-sectional view such as the view of FIG. 7I. The vertical conductive line 90 can have a pillar shape with a pair of laterally undulating sidewalls that are spaced apart along the second horizontal direction hd2 and a pair of straight sidewalls that are spaced apart along the first horizontal direction hd1. Each vertically conductive line 90 can be disposed between a neighboring pair of dielectric pillar structures 96 that contact the sidewalls of the insulating layers 60.

While the present disclosure is described employing an embodiment in which a vertical field effect transistor is provided under each vertical conductive line 90, embodiments are expressly contemplated in which a two-dimensional array of vertical field effect transistors are provided over the vertical conductive lines 90, the dielectric pillar structures 96, and the insulating cap layers 62. Generally, a vertical field effect transistor can be provided under, or over, each vertical conductive line 90. An active region of the vertical field effect transistor can be electrically shorted to a top end or a bottom end of the vertical conductive line 90.

Figure 9:
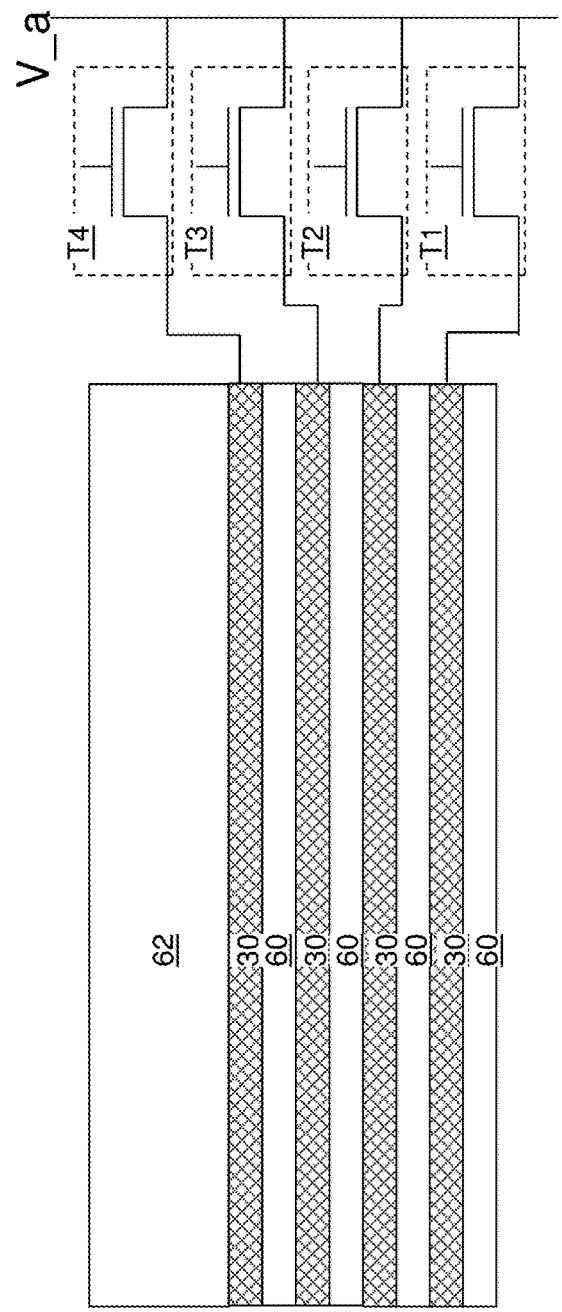
FIG. 9 is a schematic vertical cross-sectional view illustrating access transistors connected to the electrically conductive lines that function as word lines according to an embodiment of the present disclosure.

As shown in FIG. 9, word line select transistors (T1-T4) for selectively activating a respective electrically conductive layer 30 (which functions as a word line) can be formed at any suitable stage of the processing sequence. For example, the word line select transistors can be formed in, or on, the substrate 8 if the substrate 8 includes a semiconductor substrate. Alternatively or additionally, the word line select transistors can be formed prior to, concurrently with, or after formation of the vertical field effect transistors (14, 16, 18). Alternatively or additionally, the word line select transistors can be formed prior to, or after, formation of the vertical conductive lines 90. Any method for forming transistors as known in the art can be employed to provide the second select transistors. A switched node (e.g., a source region or a drain region) of each second select transistor can be connected to an end of a respective electrically conductive layer 30, and another node (e.g., a drain region or a source region) can be connected to a voltage source (or current source) which provides a node activation voltage V_a.

In one embodiment, each global bit line 10 laterally extends along the second horizontal direction hd2, and two or more of the vertical field effect transistors (14, 16, 18) can be electrically connected to the global bit line 10. The vertical field effect transistors (14, 16, 18) are configured to activate a selected vertical conductive line 90 by supplying an activation voltage thereto from a respective global bit line 10, and the word line select transistors (T1-T4) are configured to activate a selected electrically conductive layer 30 by supplying another activation voltage thereto. In one embodiment, the exemplary structure can include a monolithic three-dimensional memory device comprises a resistive random access memory (ReRAM) device.

FIGS. 10A and 10B illustrate an exemplary resistive memory cell 180 which comprises a non-filamentary barrier modulated cell (BMC), which can be employed as the resistive memory cells 180 in the exemplary structures of the present disclosure as described above.

In one embodiment, each resistive memory cell 180 can include a crystalline memory material portion 184 including a metal oxide material having at least two resistive states having different resistivity. Examples of metal oxide materials include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0 \times 10^{20}/cm^3$ to $1.0 \times 10^{21}/cm^3$.

The memory cell may also include a clam shaped barrier material portions 182 (shown in FIG. 7I and shown schematically as rectangles in FIGS. 10A and 10B), such as amorphous silicon or other suitable barrier materials. An interfacial barrier oxide 86 is located between the crystalline memory material portion 184 and a clam shaped barrier material portion 182. For a clam shaped barrier material portions 182 including silicon, the interfacial barrier oxide 86 may comprise silicon oxide.

Without wishing to be bound by a particular theory, it is believed that the BMC ReRAM device operates based on the principle shown in FIGS. 10A and 10B. FIG. 10A illustrates the BMC ReRAM device in the reset state. The switching mechanism in BMC stack is generally understood as oxygen interstitial ($0i$) generation in the interfacial barrier oxide (e.g., $SiO_2$) 86 after a RESET operation (i.e., resetting the stack into the high resistivity state, HRS). The oxygen interstitials may drift into defect rich $TiO_{2-\delta}$ where they cause a re-oxidation of the $TiO_{2-\delta}$ (e.g., recombine with oxygen vacancies in the $TiO_{2-\delta}$ near the interface). This re-oxidation decreases the conductivity of the $TiO_{2-\delta}$ material and/or increases the thickness of the insulating interfacial barrier oxide 86 and hence increases the resistance of the BMC memory cell.

FIG. 10B illustrates the BMC ReRAM device in the set state. During the SET operation, opposite voltage is applied across the cell, and Ti—O bonds are supposed to be broken down to generate Oi and Vo (oxygen vacancy) pair in the crystalline memory material portion 184. Oi may drift back to the interface between the crystalline memory material portion 184 and the clam shaped barrier material portion 182 along the electric field to increase the conductivity of the $TiO_{2-\delta}$ layer and/or decrease the thickness of the insulating interfacial barrier oxide 86 and hence decrease the resistance of the BMC memory cell to set the memory cell into the low resistivity state, LRS.

Without wishing to be bound by a particular theory, it is believed that a BMC ReRAM device of the embodiments of the present disclosure may operate based on the principle described above with respect to FIGS. 10A and 10B and/or based on an alternative principle instead of or in addition to the principle described above. For example, the BMC ReRAM device may operate by modulation of energy band structure within the cell. When the charge carrier density is modulated, the resistance of the cell is changed. In other words, the resistance of the memory cell may be modulated by changes in the band structure and consequent changes in the charge distribution instead of or in addition to the change in thickness of the interfacial barrier oxide 86.

Figure 11:
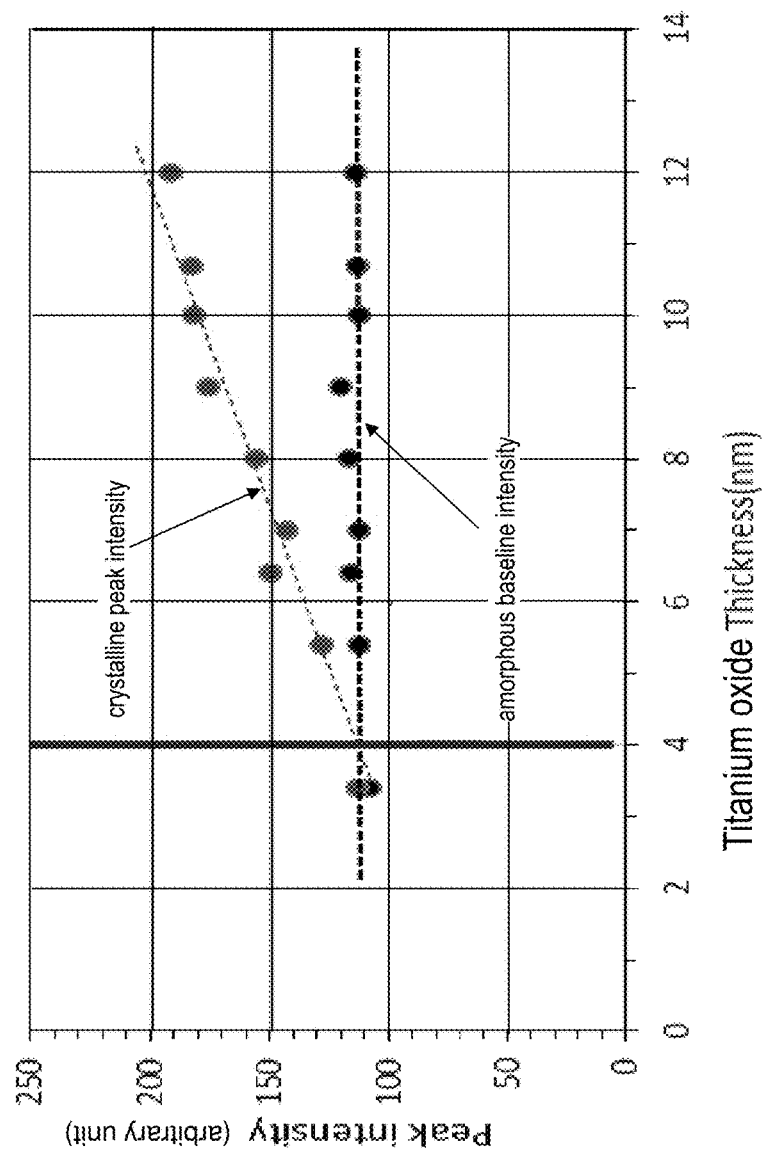
FIG. 11 is a graph illustrating the magnitude of the crystalline peak intensity as a function of the thickness of titanium oxide layers after a 30 minute anneal at the temperature of 500 degrees Celsius according to an embodiment of the present disclosure.
Figure 12:
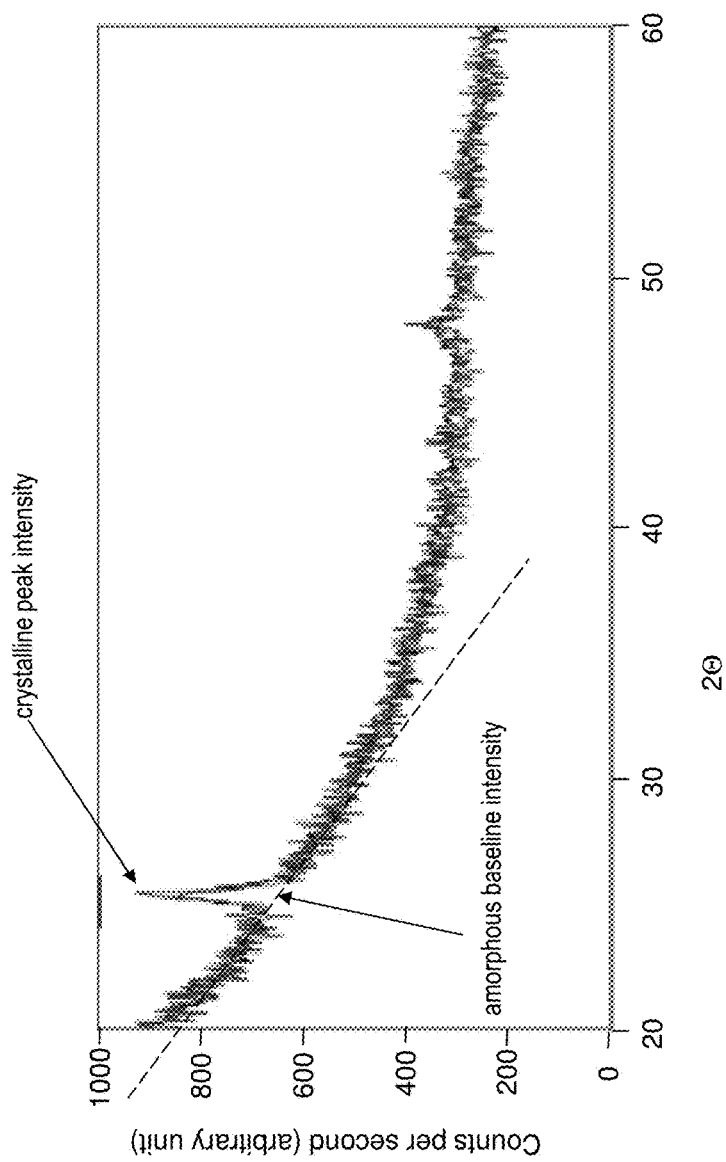
FIG. 12 is an exemplary X-ray diffraction 2θ scan data that show how the amorphous baseline intensity and the crystalline peak intensity of FIG. 11 are defined.

FIG. 11 illustrates the amorphous baseline intensity and the crystalline peak intensity at the 2θ angle that corresponds to a peak from crystalline titanium oxide in an X-ray diffraction (XRD) scan. FIG. 12 illustrates an exemplary X-ray diffraction 2θ scan data that show how the amorphous baseline intensity and the crystalline peak intensity of FIG. 11 are defined.

Referring back to FIG. 11, the horizontal interpolation line labeled "amorphous baseline intensity" represents the peak intensity of the X-ray diffraction 2θscan for various amorphous titanium oxide layers having a respective thickness indicated by the corresponding value on the x-axis. Prior to a crystallization anneal, each sample shows a normalized peak intensity that coincides with the background amorphous titanium oxide X-ray diffraction 2θscan data because each sample contains only amorphous titanium oxide material. Hence the flat interpolated line labeled "amorphous baseline intensity" that is independent of the amorphous titanium oxide thickness upon normalization by the amount of the titanium oxide material subjected to the X-ray beam.

Subsequently, the samples are subjected to an anneal process at the elevated temperature of 500 degrees Celsius for a duration of 30 seconds. The normalized peak intensity at the angle of the 2θ peak in FIG. 12 changes only for samples in which the deposited thickness of the amorphous titanium oxide material is greater than 4 nm when X-ray diffraction 2θ scans are performed on the post-annealed samples.

Thus, the inventors of the present disclosure established that crystallization of amorphous metal oxide materials such as amorphous titanium oxide can depend on at least one dimension, such as thickness (and optionally thickness, length and width) of the amorphous metal oxide material such that crystallization of the amorphous metal oxide material can proceed only above a critical thickness for a given anneal condition. Without wishing to be bound by a particular theory, it is believed that the change in the anneal condition can change the critical thickness. For example, an anneal process with a higher elevated temperature and/or a longer duration may provide a different critical thickness than an anneal process with a lower elevated temperature and/or a shorter duration. By selecting the amorphous metal oxide material, the anneal conditions, the height of the lateral cavities 189C, and the thickness of the amorphous precursor memory material layer 183L, only portions of the precursor memory material layer 183L in the lateral cavities 189C can be crystallized. By employing an etch chemistry that etches the amorphous material of the amorphous precursor memory material layer 183L selective to the crystalline material of the crystalline memory material portions 184, the amorphous precursor memory material layer 183L can be completely removed with minimal collateral etching of the crystalline memory material portions 184. Thus, the discrete crystalline memory material portions 184 can be formed with lower leakage current between adjacent resistive memory cells 180 of entire three-dimensional ReRAM device.

Referring collectively to all figures of the present disclosure and according to an aspect of the present disclosure, a resistive memory device includes an alternating stack (30, 60) of insulating layers 60 and electrically conductive layers 30 that extend along a first horizontal direction hd1. Sidewalls of the electrically conductive layers 30 are laterally recessed relative to sidewalls of the insulating layers 60 to define laterally recessed regions 89R. Discrete clam shaped barrier material portions 182 are located within a respective one of the laterally recessed regions 89R and vertically spaced apart by the insulating layers 60. Crystalline memory material portions 184 are located at least partially in a respective one of the clam shaped barrier material portions 182. A vertical conductive line 90 contacts the crystalline memory material portions 184.

In one embodiment, the crystalline memory material portions 184 straddle a vertical plane VP including the sidewalls of the insulating layers 60. In one embodiment, sidewalls of the vertically conductive line 90 that contact the clam shaped barrier material portions 182 and the crystalline memory material portions 184 have a laterally undulating profile. In one embodiment, the vertical conductive line 90 contacts the sidewalls of the insulating layers 60 and protruding portions of horizontal surfaces of the crystalline memory material portions 184.

In one embodiment, each of the clam shaped barrier material portions 182 comprises: a vertical portion contacting a respective one of the electrically conductive layers 30; an upper horizontal portion contacting a respective overlying insulating layer (60 or 62); and a lower horizontal portion contacting a respective underlying insulating layer 60. The vertical portion, the upper horizontal portion, and the lower horizontal portion can contact a respective crystalline memory material portion 184 and can have a same thickness. In one embodiment, each of the upper horizontal portion and the lower horizontal portion has a vertical sidewall located within a vertical plane VP including the sidewalls of the insulating layers 60.

In one embodiment, the crystalline memory material portions 184 comprise a sub-stoichiometric crystalline titanium oxide having a thickness of at least 4 nm, such as a thickness, length and width of at least 4 nm. In one embodiment, the clam shaped barrier material portions 182 comprise a material selected from amorphous carbon, diamond-like carbon (DLC), an amorphous semiconductor material (such as amorphous silicon), and a polycrystalline semiconductor material. An interfacial barrier oxide 86, such as a silicon oxide, can be located between each respective clam shaped barrier material portion 182 and crystalline memory material portion 184.

In one embodiment, the vertical conductive line 90 comprises a conductive metallic nitride layer 192 that contacts the crystalline memory material portions 184 and having a laterally undulating vertical cross-sectional profile. In one embodiment, the vertical conductive line further comprises a semiconductor material portion 196 that contacts the conductive metallic nitride layer 192.

In one embodiment, the vertical conductive line 90 comprises a local vertical bit line which has a pillar shape, and is disposed between a neighboring pair of dielectric pillar structures 96 that contact the sidewalls of the insulating layers 60. The electrically conductive layers 30 may comprise word lines of the ReRAM device.

In one embodiment, the resistive memory device can further comprise a vertical field effect transistor underlying or overlying the vertical conductive line 90. An active region (such as a top active region 14T) of the vertical field effect transistor is electrically shorted to a top end or a bottom end of the vertical conductive line 90.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A resistive memory device comprising:
    an alternating stack of insulating layers and electrically conductive layers that extend along a first horizontal direction, wherein sidewalls of the electrically conductive layers are laterally recessed relative to sidewalls of the insulating layers to define laterally recessed regions;
    discrete clam shaped barrier material portions located within a respective one of the laterally recessed regions and vertically spaced apart by the insulating layers;
    crystalline memory material portions located at least partially in a respective one of the clam shaped barrier material portions; and
    a vertical conductive line contacting the crystalline memory material portions.

2. The resistive memory device of claim 1, wherein the crystalline memory material portions straddle a vertical plane including the sidewalls of the insulating layers.

3. The resistive memory device of claim 2, wherein sidewalls of the vertical conductive line that contact the clam shaped barrier material portions and the crystalline memory material portions have a laterally undulating profile.

4. The resistive memory device of claim 2, wherein the vertical conductive line contacts the sidewalls of the insulating layers and protruding portions of horizontal surfaces of the crystalline memory material portions.

5. The resistive memory device of claim 1, wherein each of the clam shaped barrier material portions comprises:
    a vertical portion contacting a respective one of the electrically conductive layers;
    an upper horizontal portion contacting a respective overlying insulating layer; and
    a lower horizontal portion contacting a respective underlying insulating layer,
    wherein the vertical portion, the upper horizontal portion, and the lower horizontal portion contact the respective crystalline memory material portion.

6. The resistive memory device of claim 5, wherein each of the upper horizontal portion and the lower horizontal portion has a vertical sidewall located within a vertical plane including the sidewalls of the insulating layers.

7. The resistive memory device of claim 1, wherein the crystalline memory material portions comprise sub-stoichiometric crystalline titanium oxide having a total thickness of at least 4 nm.

8. The resistive memory device of claim 7, wherein:
    the clam shaped barrier material portions comprise amorphous silicon; and
    the crystalline memory material portions comprise the sub-stoichiometric crystalline titanium oxide having a total thickness, length and width of at least 4 nm.

9. The resistive memory device of claim 1, wherein:
    the vertical conductive line comprises a conductive metallic nitride layer that contacts the crystalline memory material portions and having a laterally undulating vertical cross-sectional profile; and
    the vertical conductive line further comprises a semiconductor material portion that contacts the conductive metallic nitride layer.

10. The resistive memory device of claim 1, wherein the vertical conductive line comprises a local vertical bit line which has a pillar shape, and is disposed between a neighboring pair of dielectric pillar structures that contact the sidewalls of the insulating layers, and wherein the electrically conductive layers comprise word lines of a barrier modulated cell of a ReRAM resistive memory device.

11. The resistive memory device of claim 1, further comprising a vertical field effect transistor underlying or overlying the vertical conductive line, wherein an active region of the vertical field effect transistor is electrically shorted to a top end or a bottom end of the vertical conductive line.

12. A method of forming a resistive memory device, comprising:
    forming an alternating stack of insulating layers and electrically conductive layers that extend along a first horizontal direction over a substrate;
    forming laterally recessed regions by laterally recessing sidewalls of the electrically conductive layers relative to sidewalls of the insulating layers;
    forming a conformal barrier material layer in the lateral recessed regions and on the sidewalls of the insulating layers, wherein lateral cavities are present in unfilled volumes of the laterally recessed regions;
    depositing an amorphous precursor memory material layer in the lateral cavities and over the conformal barrier material layer;
    selectively crystallizing portions of the amorphous precursor memory material layer in the lateral cavities into crystalline memory material portions while not crystallizing vertical portions of the amorphous precursor memory material layer on the sidewalls of the insulating layers employing an anneal process;

removing remaining amorphous portions of the amorphous precursor memory material layer selective to the crystalline memory material portions; and forming a vertical conductive line on the crystalline memory material portions.

13. The method of claim 12, wherein:

the amorphous precursor memory material layer is deposited employing a conformal deposition process; and a thickness of the amorphous precursor memory material layer is at least 4 nm.

14. The method of claim 13, wherein the remaining amorphous portions of the amorphous precursor memory material layer are removed selective to the crystalline memory material portions employing a wet etch process that provides a wet etch selectivity greater than 5 for the amorphous portions of the amorphous precursor memory material layer relative to the crystalline memory material portions.

15. The method of claim 13, wherein the amorphous precursor memory material layer comprises amorphous titanium oxide.

16. The method of claim 15, wherein the conformal barrier material layer comprises a material selected from amorphous carbon, diamond-like carbon (DLC), an amorphous semiconductor material, and a polycrystalline semiconductor material.

17. The method of claim 12, further comprising isotropically etching vertical portions of the conformal barrier material layer from the sidewalls of the insulating layers, wherein remaining portions of the conformal barrier material layer in the laterally recessed regions comprise clam shaped barrier material portions that at least partially surrounds a respective one of the crystalline memory material portions.

18. The method of claim 17, wherein the vertical conductive line is formed on top surfaces and bottom surfaces of laterally protruding portions of the crystalline memory material portions that protrude out of the clam shaped barrier material portions and on the sidewalls of the insulating layers.

19. The method of claim 12, wherein:

the vertical conductive line comprises a semiconductor material portion and a conductive metallic nitride layer that contacts the crystalline memory material portions and having a laterally undulating vertical cross-sectional profile; and the vertical conductive line has a pillar shape, and is disposed between a neighboring pair of dielectric pillar structures that contact the sidewalls of the insulating layers.

20. The method of claim 12, further comprising forming a vertical field effect transistor under, or over, the vertical conductive line, wherein an active region of the vertical field effect transistor is electrically shorted to a top end or a bottom end of the vertical conductive line.

* * * * *